(12) United States Patent
Usami

(10) Patent No.: US 6,440,773 B1
(45) Date of Patent: Aug. 27, 2002

(54) SEMICONDUCTOR DEVICE

(75) Inventor: Mitsuo Usami, Akishima (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/582,101

(22) PCT Filed: Dec. 22, 1997

(86) PCT No.: PCT/JP97/04738

§ 371 (c)(1),
(2), (4) Date: Jun. 22, 2000

(87) PCT Pub. No.: WO99/32304

PCT Pub. Date: Jul. 1, 1999

(51) Int. Cl.[7] ............................................. H01L 21/44
(52) U.S. Cl. ................................................... 438/107
(58) Field of Search ................... 438/107, 118, 438/119, 127, 613, 108, 121, 459, 460, 464, 928

(56) References Cited

U.S. PATENT DOCUMENTS

| 4,257,156 A | * | 3/1981 | Houston |
| 5,399,907 A | * | 3/1995 | Nguyen et al. |
| 5,480,842 A | * | 1/1996 | Clifton et al. |
| 5,733,814 A | * | 3/1998 | Flesher et al. |
| 5,763,328 A | * | 6/1998 | Yoshihara et al. |
| 5,956,605 A | * | 9/1999 | Akram et al. |
| 6,063,647 A | * | 5/2000 | Chen et al. |
| 6,064,456 A | * | 5/2000 | Taniguchi et al. |
| 6,162,703 A | * | 12/2000 | Muntifering et al. |
| 6,251,705 B1 | * | 6/2001 | Degani et al. |
| 6,268,237 B1 | * | 7/2001 | Flesher et al. |

* cited by examiner

Primary Examiner—David L. Talbott
Assistant Examiner—David Zarneke
(74) Attorney, Agent, or Firm—Antonelli, Terry, Stout & Kraus, LLP

(57) ABSTRACT

An IC card strong against bending and with a thin semiconductor chip mounted thereon is disclosed which is further provided with a reinforcing plate to reduce damage of the semiconductor chip caused by a point pressure. The IC card is employable even under a mechanically severe environment and is thus highly reliable.

24 Claims, 50 Drawing Sheets

FIG. 50
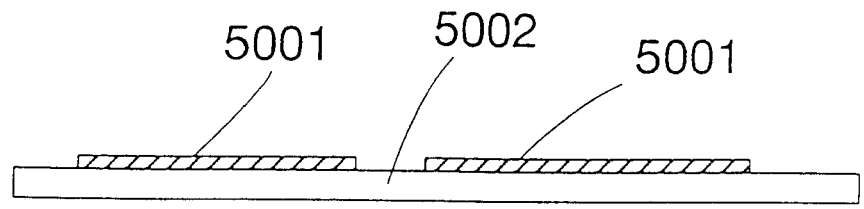
(a)
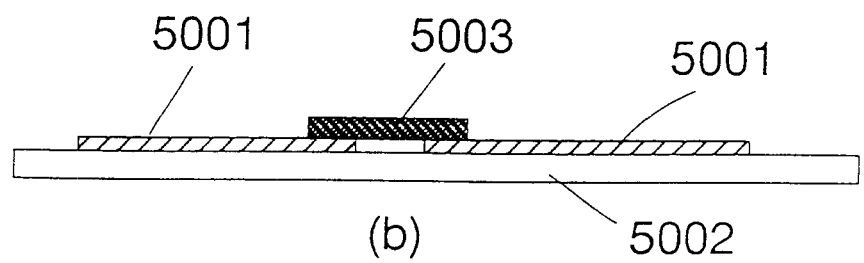
(b)
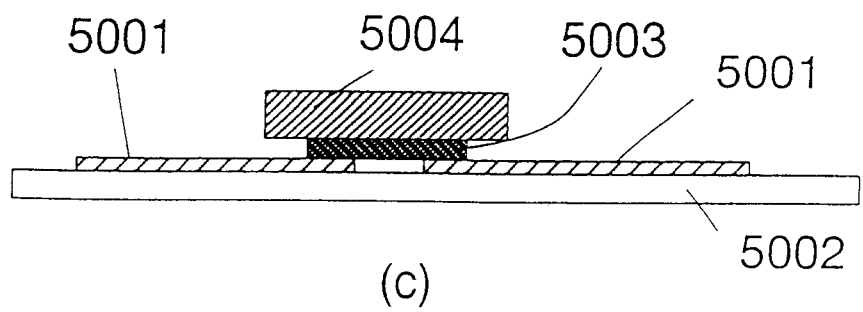
(c)
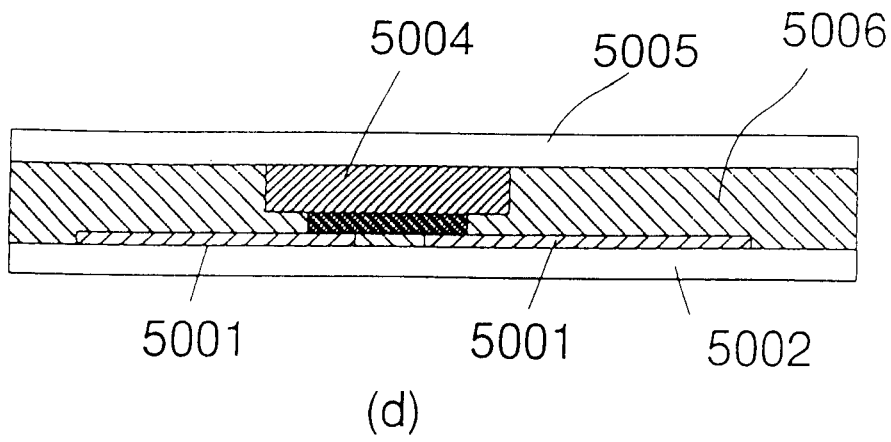
(d)

SEMICONDUCTOR DEVICE

TECHNICAL FIELD

The present invention relates to a thin semiconductor device, and especially a highly reliable IC card which has flexibility.

BACKGROUND ART

Conventional thin semiconductor devices, e.g., IC cards, are disclosed on pages 603 to 605 of "Electronics, Information and Communication Handbook" (second issue of the first edition, published on Apr. 30, 1990), edited by a corporation of the institute of electronics, information and communication engineers, printed by OHM Corporation and disclosed in Japanese Patent Publication No. Hei 7-99267.

FIG. 31 shows a sectional structure of a conventional contact-type IC card chip module. Bonding pads 3131 formed on a module substrate 3136 are connected to external terminals of a semiconductor chip 3134 through bonding wires 3132. These components are molded with a molding resin 3133. The bonding pads 3131 are connected through via holes 3137 formed in the module substrate 3136, which is a hard substrate, to contact electrodes 3135, which are for output and input of signals to and from the exterior and for the supply of electric power to an IC card.

FIG. 34 shows a process for manufacturing an IC card which includes the IC card chip module shown in FIG. 31. The manufacturing process comprises an upper-side photoresist films forming step for patterning the bonding pads 3131, etc. on an upper side of the module substrate 3136, a lower-side photoresist films forming step for patterning the contact electrodes 3135, etc., a conductive film etching step using a photoresist film as a mask, a step of forming via holes 3137 in the module substrate (a glass epoxy substrate) 3136, a step of plating the interior of each via hole 3137, a step of cutting a plurality of semiconductor chips 3134 (pellets), formed separately on a semiconductor wafer, a step of bonding each of the thus-cut semiconductor chips 3134 onto the module substrate 3136, a step of bonding the electrode on the semiconductor chip and the bonding pads 3131 with each other through wires 3132, a step of molding the semiconductor chip and bonding pads with resin to afford a molded chip (completion of an IC chip module), a step of milling a card substrate for mounting the molded chip thereon to form a recess, a step of applying an adhesive to the milled recess, and a step of bonding the molded chip into the recess.

FIG. 6 is a sectional view of a conventional non-contact type IC card. As shown in the same figure, a semiconductor chip 62 and the ceramic capacitors 61 and 64 are mounted on a hard substrate 66. These are connected together through bonding wires and are molded with an epoxy resin 63. The ceramic capacitor 64 is connected to a winding coil 67, which is for output and input of signals and for the reception of energy. These components are mounted between two overcoating substrates 65, which are softer than the substrate 66.

FIG. 41 is a sectional view of an IC card in which a thin capacitor chip 4151 and a thin IC chip 4153 are mounted on a neutral surface. External terminals of the thin capacitor chip 4151 and the thin IC chip 4153 are connected, using an electrically conductive adhesive, to electrodes 4155, 4157, and 4158, which are screen-printed on a flexible substrate 4156. Further, spacers 4154 and 4159 are disposed in regions where the thin capacitor chip and the thin IC chip are not present, and an upper cover 4152 is provided opposedly to the substrate 4156 so as to cover those components.

In fabricating IC cards with the structures shown in FIGS. 6 and 31, certain problems arise. For example, the manufacturing process becomes long and the manufacturing cost increases, as explained above with reference to FIG. 34. A further problem is involved therein such that the IC chip is as thick as several hundred microns and cracks upon the imposition of a bending stress thereon. A structure is known in which a reinforcing member is provided for the prevention of cracking against a bending stress. However, since this structure is for the prevention of bending, the reinforcing member used is thick and the IC card itself cannot be made thinner than 0.76 mm or so.

The IC card of the structure shown in FIG. 41 is advantageous in that the manufacturing cost is low, and that the card is highly resistive to a bending stress because a thin IC chip is disposed on the neutral surface. However, it was found out for the first time by the inventor in the present case that the thin capacitor chip and the thin IC chip were easily broken under the action of a local compressive force (point pressure) with a ball-point pen or a pencil, and that the use of the IC card is limited.

It is an object of the present invention to provide a semiconductor chip-mounted card having a structure which permits a reduction in the manufacturing cost of semiconductor devices having various thicknesses.

It is another object of the present invention to provide a semiconductor device using the above semiconductor chip-mounted card.

It is a further object of the present invention to provide a highly reliable, card-like semiconductor device having an IC chip which is difficult to break even under a local pressure (point pressure), particularly a local pressure applied to a region not larger than 1 mm².

It is another object of the present invention to provide a highly reliable, non-contact type IC card.

It is a still further object of the present invention to provide a highly reliable multi-function IC card which is easy to use.

DISCLOSURE OF THE INVENTION

The above objects are achieved by a card-like semiconductor device having a thin, flexible IC chip which is 0.1 to 110 microns in thickness, wherein a reinforcing plate harder than a card substrate is provided on at least one side of the IC chip for reinforcement against a local stress. Since a local stress to be imposed on the IC chip is dispersed by the reinforcing plate, the IC chip becomes difficult to break.

For the reinforcing plate a metallic or resinous plate may be used. The use of a metallic plate permits the formation of a thinner film than in the use of a resinous plate. A suitable thickness of the reinforcing plate is in the range of 1 to 110 microns. With such a degree of thickness, the reinforcing plate can be bent following a bending stress. The reinforcing plate may be provided on both sides of the IC chip.

A semiconductor device of a higher reliability can be obtained by using a shade film which intercepts light (electromagnetic wave) traveling to the IC chip.

For the shade film, a conductive paste may be used. The shade film can be formed simultaneously with the formation of the electrode or coil by printing onto a card substrate using a conductive paste. By selecting a suitable material, the reinforcing plate can be used as a shade film.

By using a master IC chip and a plurality of slave IC chips, a semiconductor device of a higher reliability can be obtained. The master and slave IC chips are connected with each other. The master IC chip has the function of exchanging data with the exterior, while the plural slave IC chips have the function of storing data of the same contents and issuing an "abnormal" signal upon the destruction of any chip. Even in the event of the destruction of any of the slave IC chips, it is possible to read out the stored data.

Printed coil may be formed on one side or both sides of the card substrate. It may be formed on only one side in the case of being used in close proximity to the IC card reader. By forming coils on both sides of the card substrate, it becomes possible to detect a weaker radio wave.

The use of an IC chip having a plastic resin-coated surface permits a further improvement of reliability. As a result, a stress onto the IC chip surface induced by conductive particles can be relaxed when external terminals of the IC chip are connected to substrate electrodes through an anisotropic conductive adhesive or film.

By using an IC chip with projection-like bumps formed at the portions of the connecting terminals, a further improvement of reliability can be attained.

In the case where an IC chip is disposed between the first and second substrates, if spacers having apertures are disposed in the IC chip region and between the first and second substrates, it is possible to further improve the reliability. With such spacers, even when a stress is applied in the thickness direction of the IC card, it is possible to diminish the stress on the IC chip. In the case of a thin IC chip (50 microns or less), the spacers may be omitted.

By connecting the external terminals of an IC chip with the printed electrodes formed on a substrate through an anisotropic conducive film, a less expensive and highly reliable semiconductor device can be provided.

In the case of a semiconductor device which is an IC card, by providing external terminals on the card, a thin (300 microns or less) contact type IC card can be provided. With a coil also provided, there is provided a multi-purpose IC card for both contact and non-contact use.

Mounting an IC chip within a magnetic card permits application to uses for various purposes.

By disposing an IC chip within a displacement of 30% or less of the thickness of a card-like semiconductor device from the position of a neutral surface of the semiconductor device, a semiconductor device which is practical in point of cost and reliability can be provided.

By using an IC chip which is easier to bend than the constituent substrate of a semiconductor device, it is possible to further improve the reliability.

By forming a plurality of holes in a peripheral portion of an IC chip, there can be provided a contact type IC card.

By using a once-write type memory as a memory provided within an IC chip, it is possible to provide an economical and safe semiconductor device. This is because the use of a once-write type memory permits a reduction of the memory cell area to about half of that of $E^2PROM$, and further, because re-write is impossible.

In a semiconductor device wherein printed electrode patterns formed on a surface of a first substrate are face-down bonded opposedly to external terminals of an IC chip, and a second substrate is disposed so as to cover the printed electrode patterns on the first substrate and also cover an upper surface of the IC chip, if a hole is formed in part of the second substrate, and another substrate having electrodes on both the surface and back thereof is embedded into the said hole, a semiconductor device superior in both economy and reliability can be provided.

If an IC chip and an IC card or an IC card controlling device are electrically connected to a capacitor chip of a large capacitance, there can be provided a highly reliable IC card without the loss of the storing and controlling function of the IC chip, even if the supply of an electric energy to the IC chip is interrupted irregularly.

In case of a card-like semiconductor device to be applied to a use which is not premised on the card being carried by man, such as a tag, or applied to a use in which a local stress is not imposed on the IC chip, it is not always necessary to use the reinforcing plate.

By using the reinforcing plate according to the present invention, a highly reliable card-like semiconductor device which is highly resistive to a point pressure can be provided, even in the case of a thin IC card having a thickness of about 100 to 250 microns. By printing coil patterns on both sides of a substrate, it is possible to reduce the area occupied by the coil. By using a shade film having electric conductivity, it is possible to prevent a malfunction of a thin IC card caused by light, ultraviolet rays, or static electricity. In the case of a proximity type IC card, it suffices to form a coil pattern on one side, whereby an IC card can be provided at low cost. By providing a thin IC chip on a neutral surface using a printed coil and an anisotropic conductive adhesive, it is possible to provide a less expensive, contact type IC card. Further, by forming a polyimide film on a chip surface, an IC card can be fabricated in a high yield.

The card-like semiconductor device according to the present invention is employable not only as a member's card or an employee card, but also as a tag to be attached to goods, electronic money, licenses, telephone cards, railroad tickets, gift certificates, book-cards, or amusement park tickets.

BRIEF DESCRIPTION OF THE DRAWINGS

FIG. 50 is a sectional view showing an IC card manufacturing process.

BEST MODE OF CARRYING OUT THE INVENTION

Figure 1:
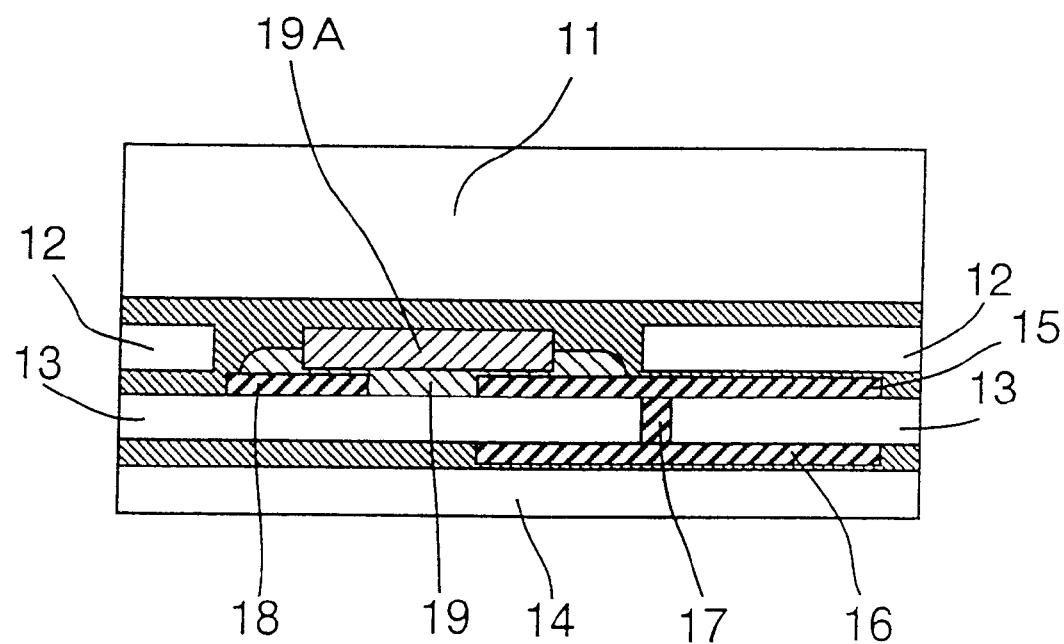
FIG. 1 is a sectional view of a principal portion of a card-like semiconductor device according to the present invention.

The embodiments of the present invention will now be described in detail. FIG. 1 is a sectional view of a principal portion of an IC card according to the present invention. In the same figure, the numeral 11 denotes an upper cover, numeral 12 denotes a spacer, numeral 13 denotes a thin substrate, numeral 14 denotes a back cover, numeral 15 denotes a surface-side coil, numeral 16 denotes a back-side coil, numeral 17 denotes a through hole, numeral 18 denotes a thin substrate electrode, numeral 19 denotes a conductive adhesive, and the numeral 19A denotes an IC chip. The IC chip 19A is about 50 $\mu$m thick and is flexible. The coils 15 and 16 are formed on both sides of the thin substrate 13 (about 50 $\mu$m thick) by printing, using a conductive paste.

Both coils are connected together through the through hole 17. The IC chip 19A is connected to the coil 15 and the electrode 18 using the conductive adhesive 19. The IC chip 19A is laminated to both the upper cover 11 and the back cover 14 in a sandwiched fashion and the spacers 12 are placed around the IC chip to ensure the surface flatness.

An antenna of a non-contact IC card is formed by both surface-side and back-side coils. Since the IC chip 19A is disposed on a neutral surface, the upper cover 11 is formed with a greater thickness than the back cover 14. In this embodiment the total thickness of the thin substrate 13, the back cover 14 and the coils 15 and 16 is set approximately equal to the thickness of the upper cover. The chip used may range in thickness from 0.1 to 110 microns. The thickness of the IC card can be adjusted by selecting a suitable thickness for the upper cover and that of the back cover. It is desirable that the IC chip 19A be disposed on a neutral surface of the IC card, but in practical use, a 30% error of the IC card thickness from a neutral surface of the card is allowed.

Figure 49:
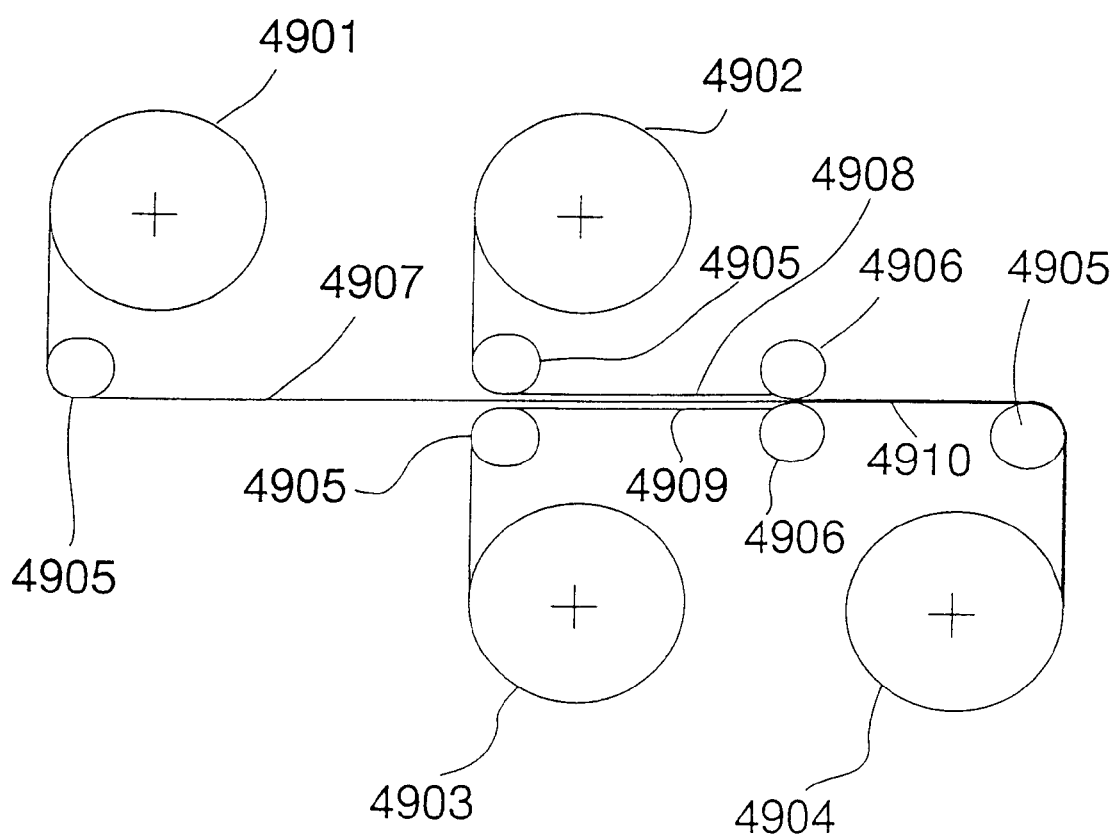
FIG. 49 illustrates a method for the mass production of IC card.

Such a structure permits mass-production of the IC card, as shown in FIG. 49. In the same figure, the numeral 4901 denotes a roll on which is wound a thin substrate sheet is wound with IC chips mounted thereon, numeral 4907 denotes the thin substrate sheet with IC chips mounted thereon, numeral 4902 denotes a roll with an upper cover sheet wound thereon, numeral 4908 denotes the upper cover sheet, numeral 4903 denotes a roll with a lower cover sheet wound thereon, numeral 4909 denotes the lower cover sheet, numeral 4910 denotes an IC card sheet which comprises the substrate sheet with IC chips mounted thereon and the upper and lower cover sheets bonded thereto, numeral 4904 denotes a roll with the IC card sheet wound thereon, numeral 4905 denotes a guide roller, and the numeral 4906 denotes a pressure roller for laminating the upper and lower sheets to the substrate sheet. After an adhesive is applied to the surface and to the back of the substrate sheet 4907 with IC chips mounted thereon, the upper cover sheet 4908 and the lower cover sheet 4909 are laminated to the substrate sheet 4907 in a sandwiching fashion. The IC card sheet thus obtained as a laminate is then cut to a predetermined size, whereby IC cards can be obtained. The adhesive may be applied to the upper and lower cover sheets.

By this method a large quantity of IC cards can be produced at low cost.

If a reinforcing plate (not shown) for reinforcement against a point pressure is disposed above and/or below each IC chip 19A, it is possible to improve the reliability.

Figure 2:
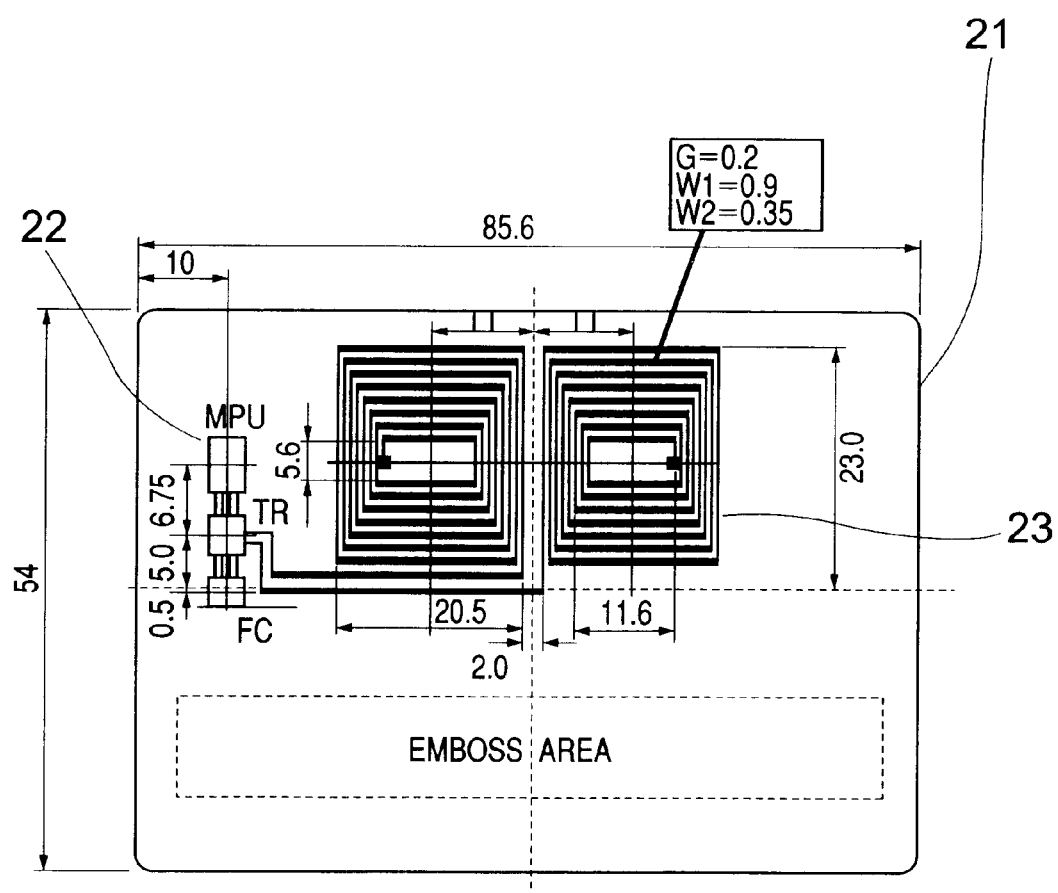
FIG. 2 is a plan view thereof.

FIG. 2 is a plan view of an IC card according to the present invention. A printed coil 23 and an IC chip 22 are mounted on a card substrate 21. The IC chip is provided with an MPU (microprocessor unit) having a memory section and a memory control section and possessing a security function, a high-frequency circuit (TR=transceiver) for control by radio, and a capacitor (FC=flexible condenser) for the storage of energy. An embossed area shown in the same figure indicates an area in which, for example, the ID number of a person who holds the IC card is displayed. It is effective for the reinforcing plate to be disposed in the area where the MPU is present. If the reinforcing plate is disposed so as to also cover the area where the TR and FC are present, it is possible to improve the reliability of the IC card.

Figure 3:
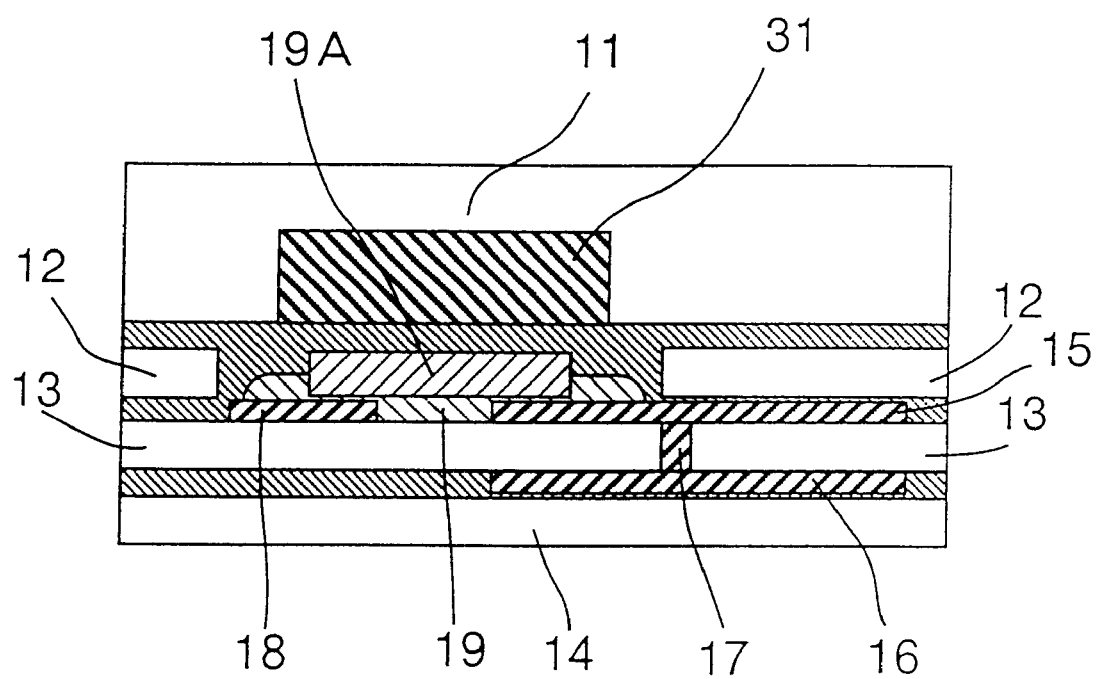
FIG. 3 is a sectional view of a principal portion of a card-like semiconductor device according to the present invention.

FIG. 3 is a sectional view of a principal portion of a card-like semiconductor device provided with a reinforcing plate. In FIG. 3, the same reference numerals shown in FIG. 1 represent the same portions as in FIG. 1. An upper surface of an IC chip 19A is backed with a reinforcing plate 31, which is higher in Young's modulus than the base material of the card. It is preferable that the size of the reinforcing plate 31 be larger than that of the IC chip, but in practical use, the size of the reinforcing plate 31 may be equal to or somewhat (several %) smaller than that of the IC chip. The thickness of the reinforcing plate 31 may be set in the range of 10 to 1,000 percent of the thickness of the IC chip 19A. Preferably, the thickness of the reinforcing plate 31 is several tens of microns.

Figure 4:
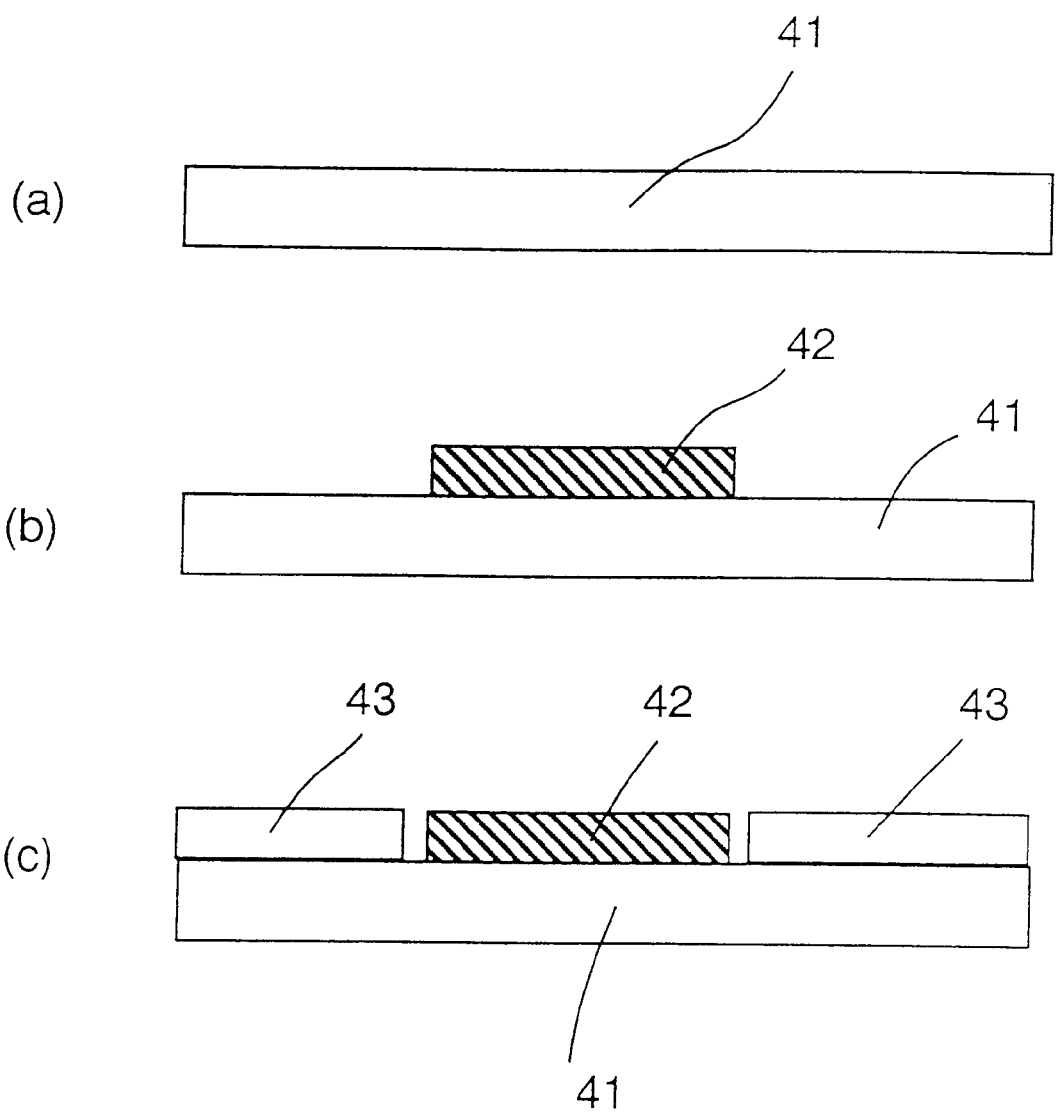
FIGS. 4(*a*) to 4(*c*) are sectional views of a principal portion of a card-like semiconductor device, showing a process for mounting a reinforcing plate according to the present invention.

FIG. 4 is a sectional view showing how to mount a reinforcing plate to a cover substrate. First, a reinforcing plate 42 (e.g., a stainless steel plate), formed of a material having a Young's modulus higher than that of the cover substrate, is fixed to a cover substrate 41 (e.g., a PET substrate) using an adhesive. Next, a spacer 43 having about the same thickness as the thickness of the reinforcing plate 42 is affixed to the cover substrate 41 around the reinforcing plate. As a result, an upper cover having the reinforcing plate of the structure shown in FIG. 3 can be obtained. By attaching a plurality of reinforcing plates to a sheet-like cover substrate (a sheet substrate), the sheet substrate can be used as a cover sheet in an IC card according to the present invention.

Figure 5:
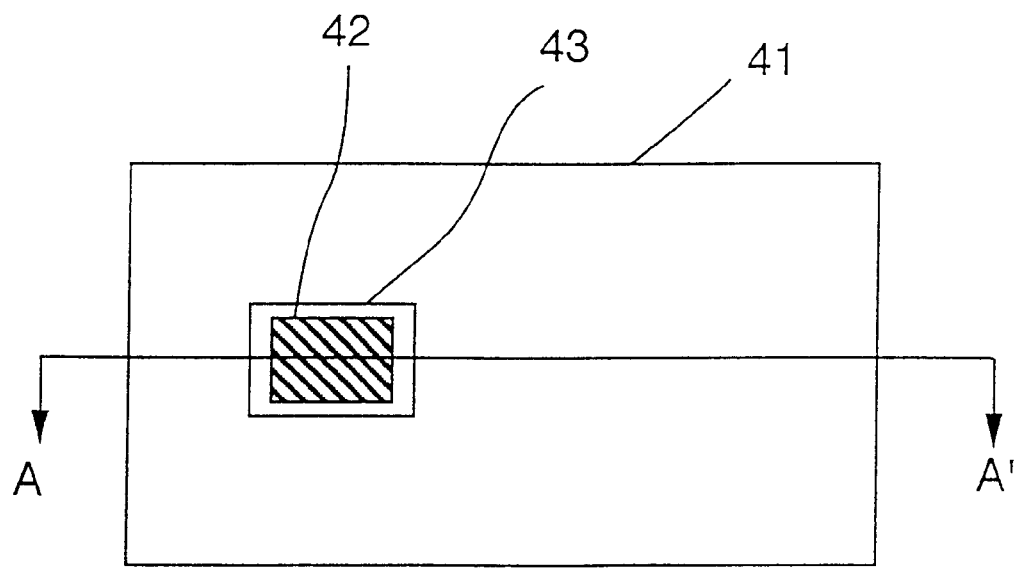
FIG. 5 is a plan view of a cover substrate provided with the reinforcing plate.
Figure 6:
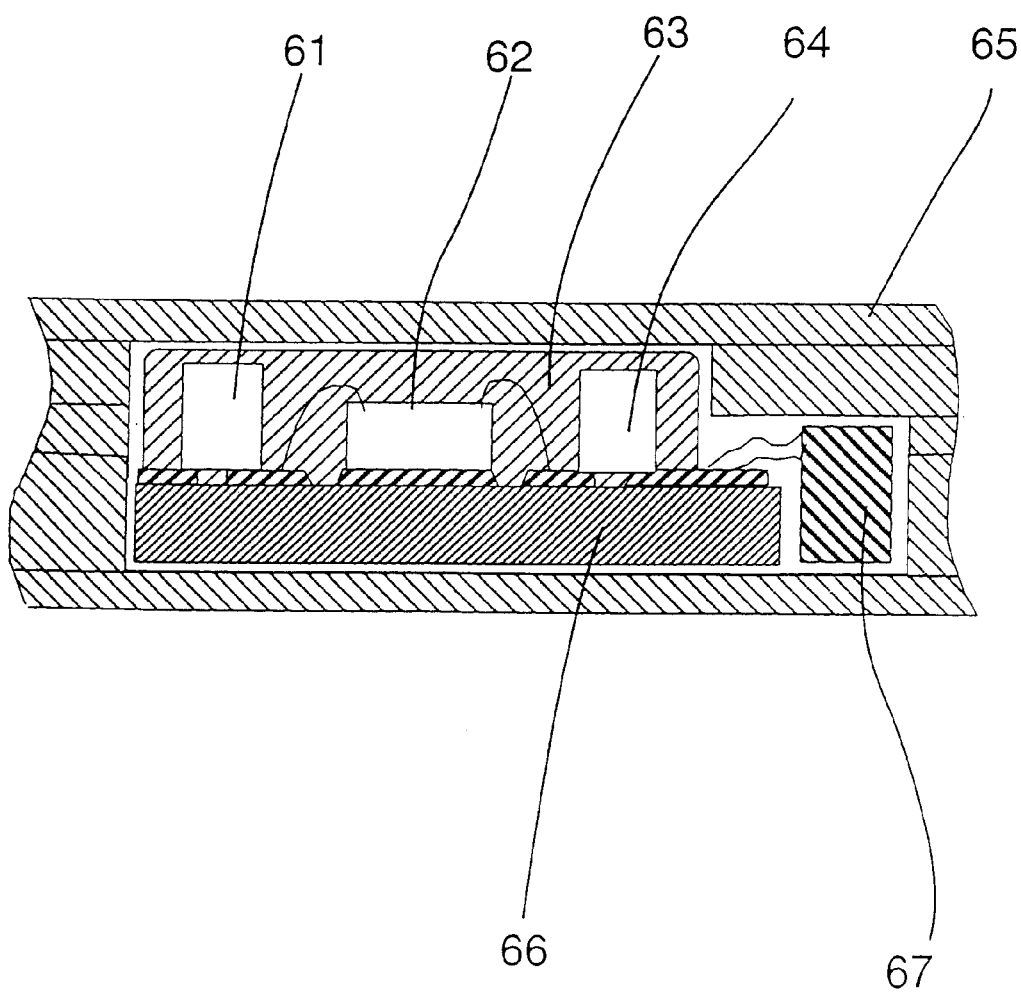
FIG. 6 is a sectional view of a principal portion of a conventional IC card.

FIG. 5 is a plan view of the cover substrate having the reinforcing plate and FIG. 4(*c*) is a sectional view taken along line A–A' in FIG. 5. An IC chip is disposed in a plane area where the reinforcing plate is provided.

Figure 7:
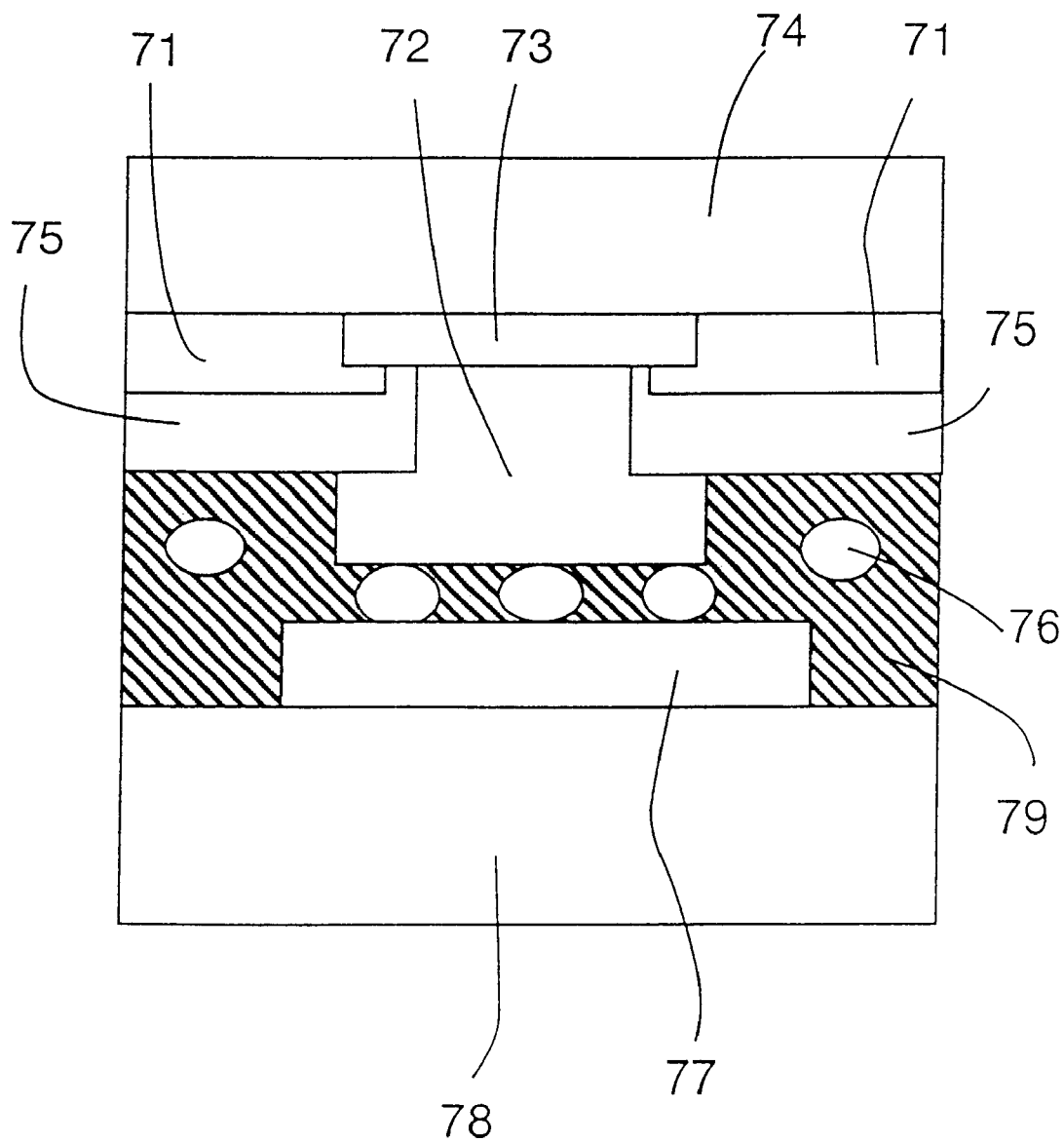
FIG. 7 is a sectional view of a principal portion of a card-like semiconductor device, showing a connection between an external terminal of an IC chip and an electrode on a card substrate, according to the present invention.

FIG. 7 is a sectional view of a principal portion, showing a connection between an external terminal of an IC chip and an electrode of a thin substrate in a card-like semiconductor device according to the present invention. An insulating film 71 and a polyimide film 75 are formed around an electrode 73 which is present on the main surface of an IC chip 74. A gold film 72 (an external terminal of the IC chip) is formed by plating on the surface of the electrode 73. Using an anisotropic conductive adhesive 79, the gold film 72 is connected to an electrode 77 formed on a thin substrate 78. The gold film 72 and the electrode 77 are electrically connected to each other through fine conductive particles 76 of 1 to 20 microns contained in the anisotropic conductive adhesive. It is preferable that a projecting height of the gold film 72 from the polyimide film 75 be larger than the diameter of the conductive particles 76. By setting the height in this manner, it is possible to diminish a short-circuit caused by the conductive particles at the edge of the IC chip.

It is desirable that the Young's modulus of the polyimide film 75 be lower than that of the insulating film 71, whereby it is possible to prevent a local stress from being applied to the IC chip 74 by the conductive particles 76.

Figure 8:
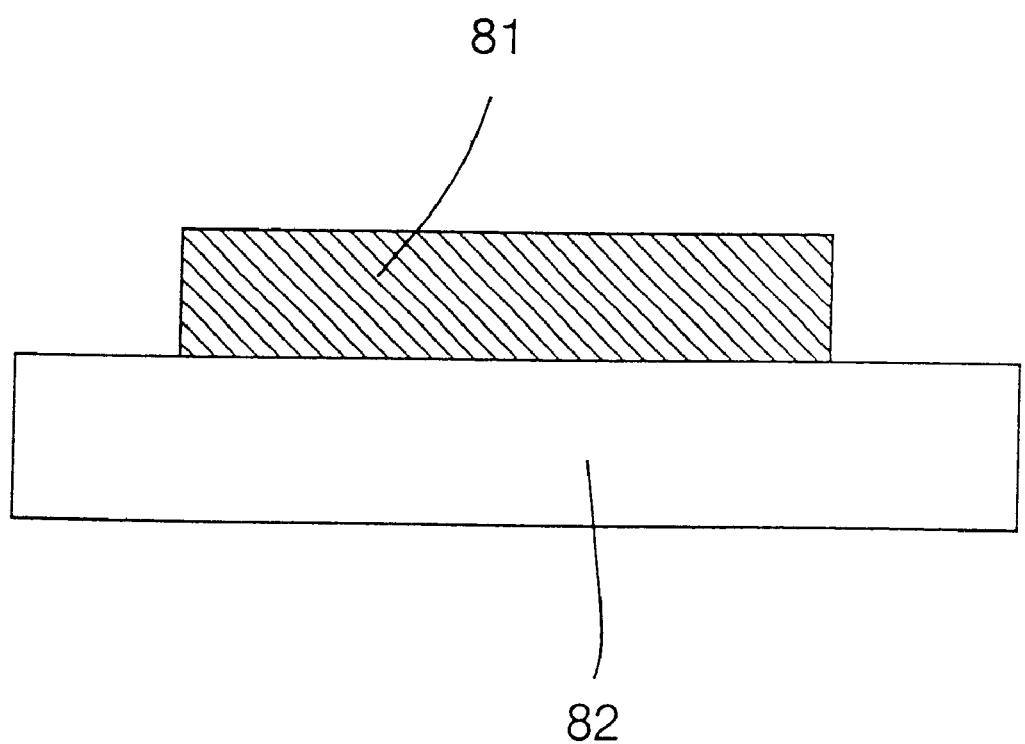
FIG. 8 is a sectional view of a principal portion of a card-like semiconductor device according to the present invention.

As shown in FIG. 8, a semiconductor chip 81 whose back side has concaves and convexes of 0.1 to 3 microns may be mounted on a card substrate 82. Such concaves and convexes are formed when the back of a wafer with plural semiconductor chips formed thereon is made into a thin film by spin etching. The IC chip which has been made into a thin film by spin etching is strong against bending and load.

Figure 9:
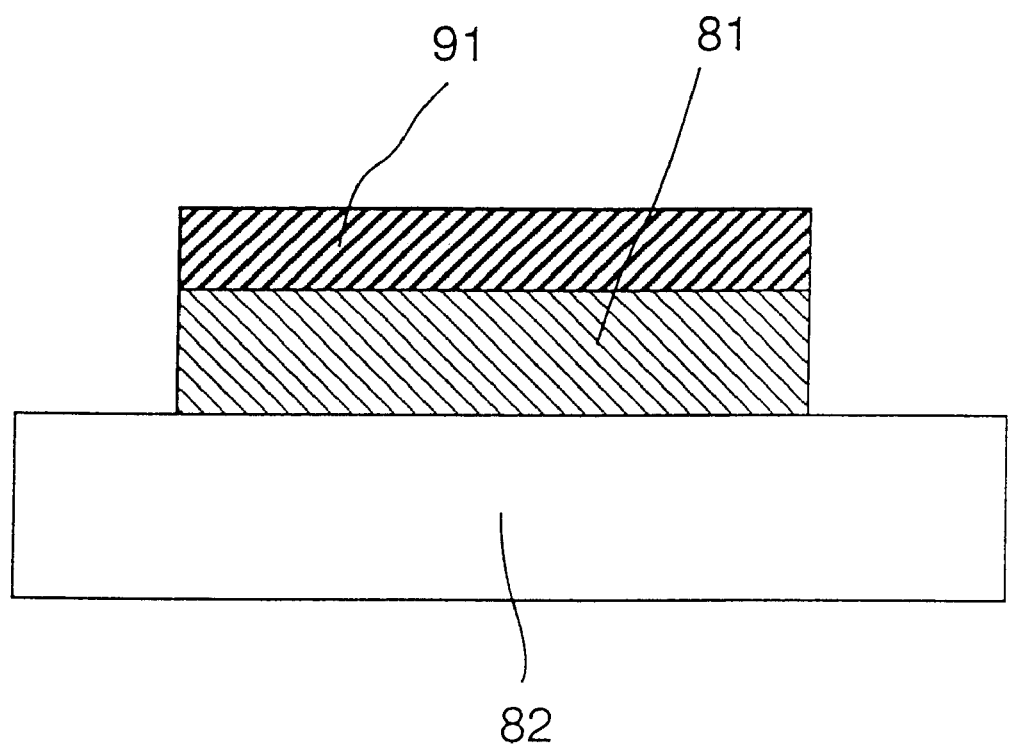
FIG. 9 is a sectional view of a principal portion of a conventional IC card.

In an IC chip mounted on a conventional IC card, as shown in FIG. 9, there remains a damage layer 91 resulting from a mechanical grinding which is performed to thin the semiconductor substrate. When the IC card is bent, the said damage layer causes cracks, with the result that the IC card becomes low in mechanical strength. The damage layer is removed by a chemical treatment. The chemicals that there may be used include fluoronitric acid, potassium hydroxide, ammonia water, and hydrazine.

Figure 10:
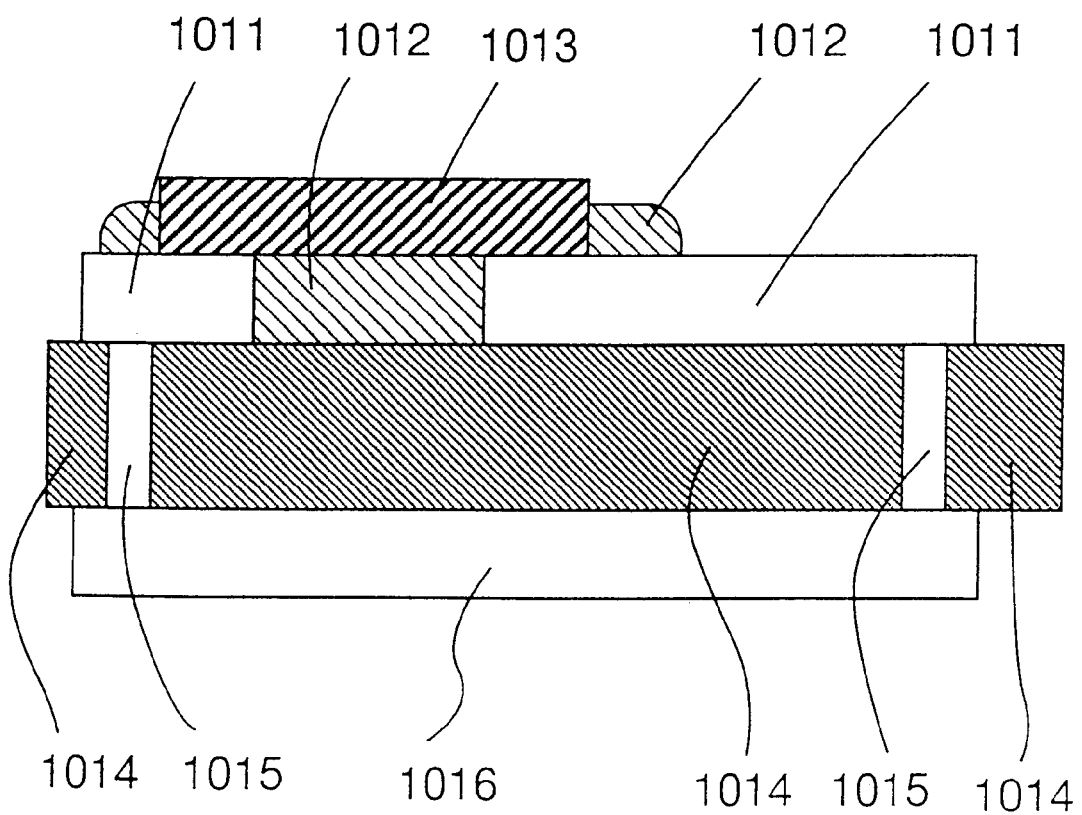
FIG. 10 is a sectional view of a principal portion of a card-like semiconductor device according to the present invention.

FIG. 10 is a sectional view of a principal portion, showing a case where a plane layout area of the back coil (back pattern) shown in FIG. 1 was extended to a plane layout area of an IC chip. An external terminal of a thin IC chip 1013 is connected to a surface electrode pattern 1011 with a conductive adhesive 1012. The surface electrode pattern 1011 is formed on a flexible substrate 1014 by screen printing, for example, and is connected to a back pattern 1016 via through holes 1015. It is preferable that the size of the back pattern 1016 be equal to or larger than the size of the chip 1013. The back pattern is employable as a shade film by using a light shielding material. The surface pattern 1011 and the back pattern 1016 may be combined together to form printed coils. By selecting a hard material, the back pattern can be used as a reinforcing plate against a point pressure. With a sheet bonded or laminated to an upper or lower surface of the thin IC chip 1013, the IC chip is disposed on a neutral surface of an IC card. The neutral surface that is referred to herein tolerates a displacement of 30% of the card substrate thickness from an ideal neutral surface position in the accuracy of the manufacturing process.

Figure 11:
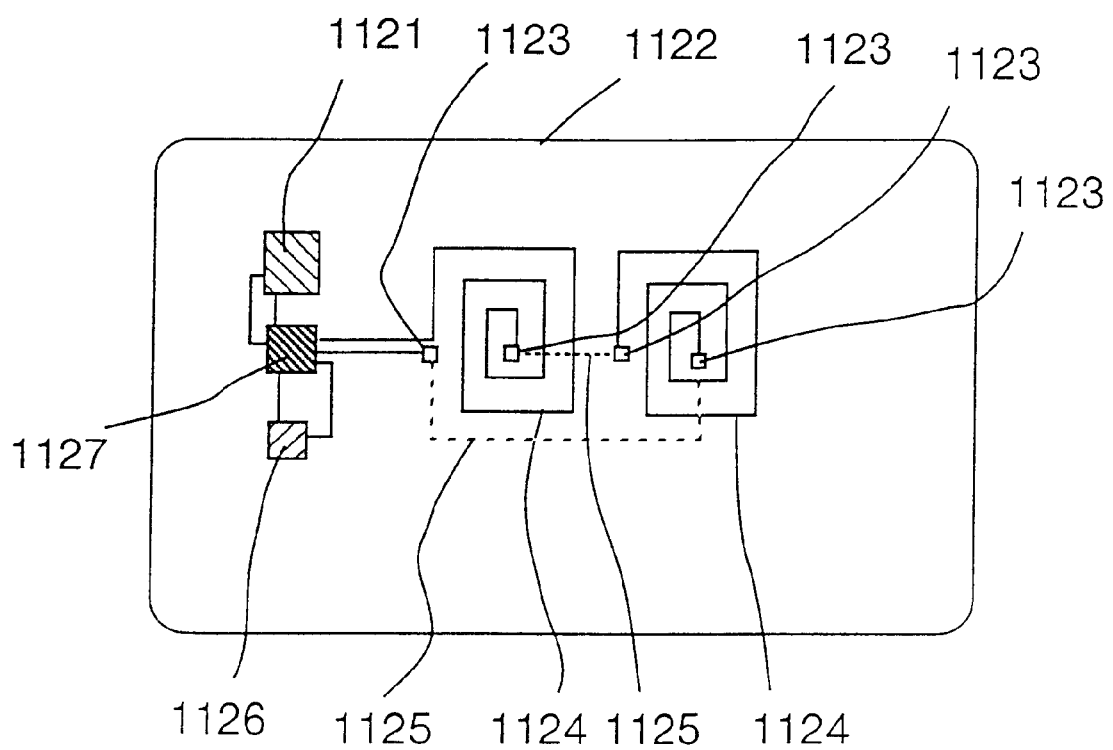
FIG. 11 is a plan view of a card-like semiconductor device according to the present invention.

FIG. 11 shows a plane structure of an IC card according to the present invention. Although this IC card is of the configuration having three thin film chips mounted thereon, no limitation is made thereto. It is optional whether the number of chips is to be one or a plural number. Further, IC chips may be laminated together. In this embodiment, a thin microprocessor chip 1121, a thin transceiver chip 1127, and a thin capacitor chip 1126 are mounted on an IC card substrate 1122. These components may be constituted by a single chip. Surface patterns 1124 are connected to back patterns 1125 via through holes 1123. Thus, efficient coil patterns of a small area are formed. As for the coil shape, various shapes of patterns are formed according to system design conditions, provided that a common point is to form both surface and back patterns. Where required, part of the back pattern is placed right under the back of an IC chip to protect the IC chip electrically, mechanically, and chemically from ultraviolet rays, static electricity, electromagnetic waves, chemicals, and sunlight.

Figure 12:
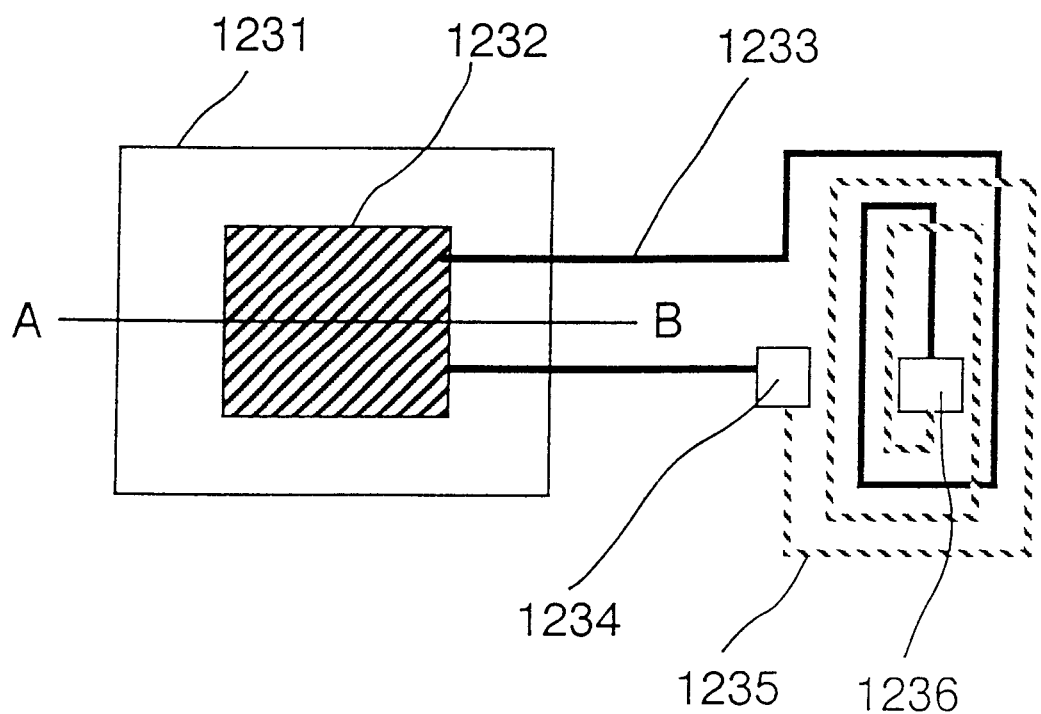
FIG. 12 is a plan view of a principal portion of a card-like semiconductor device according to the present invention.

FIG. 12 is a plan view of a principal portion of a card-like semiconductor device according to the present invention. A back protective pattern 1231 is formed on the lower surface side of an IC chip 1232, so as to be opposed to a main surface of the IC chip. An upper-side pattern 1233 of coil is connected to a back pattern 1235 through a through hole 1236, and is again exposed as a pattern to the upper side through a through hole 1234. The back protective pattern 1231 and the back pattern 1235 can be formed in a single process.

Figure 13:
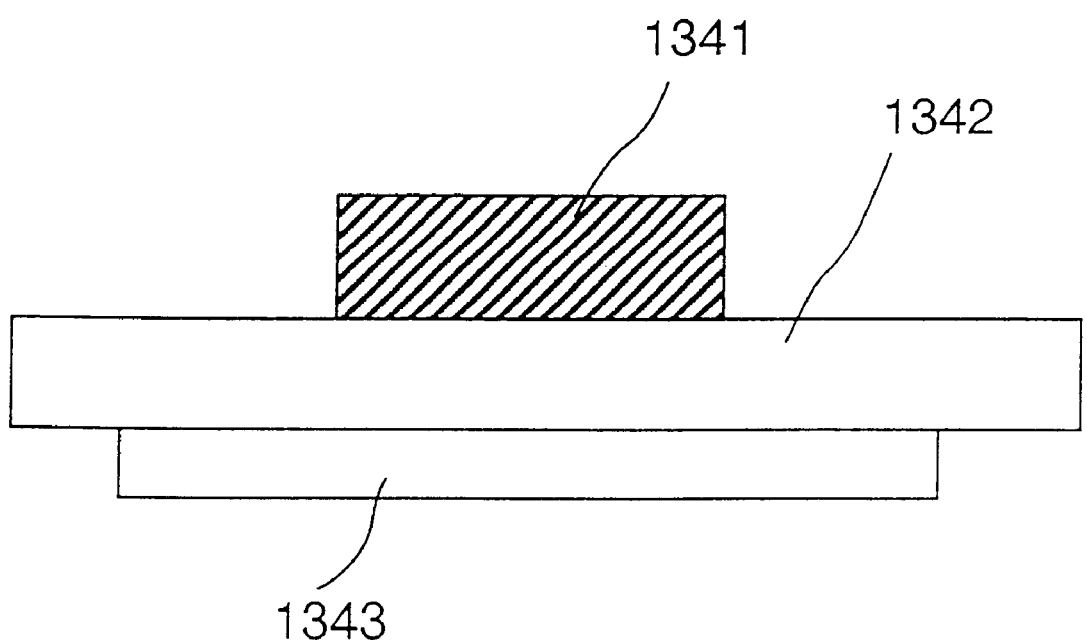
FIG. 13 is a sectional view of a principal portion of a card-like semiconductor device according to the present invention.

FIG. 13 is a sectional view of a principal portion where the back protective pattern in the semiconductor device shown in FIG. 12 is formed. A back protective pattern 1343 is formed on the underside of a substrate 1342, and the size thereof is larger than that of an IC chip 1341. The back protective pattern 1343 is employable as a shade film or as a protective sheet against a point pressure.

Figure 14:
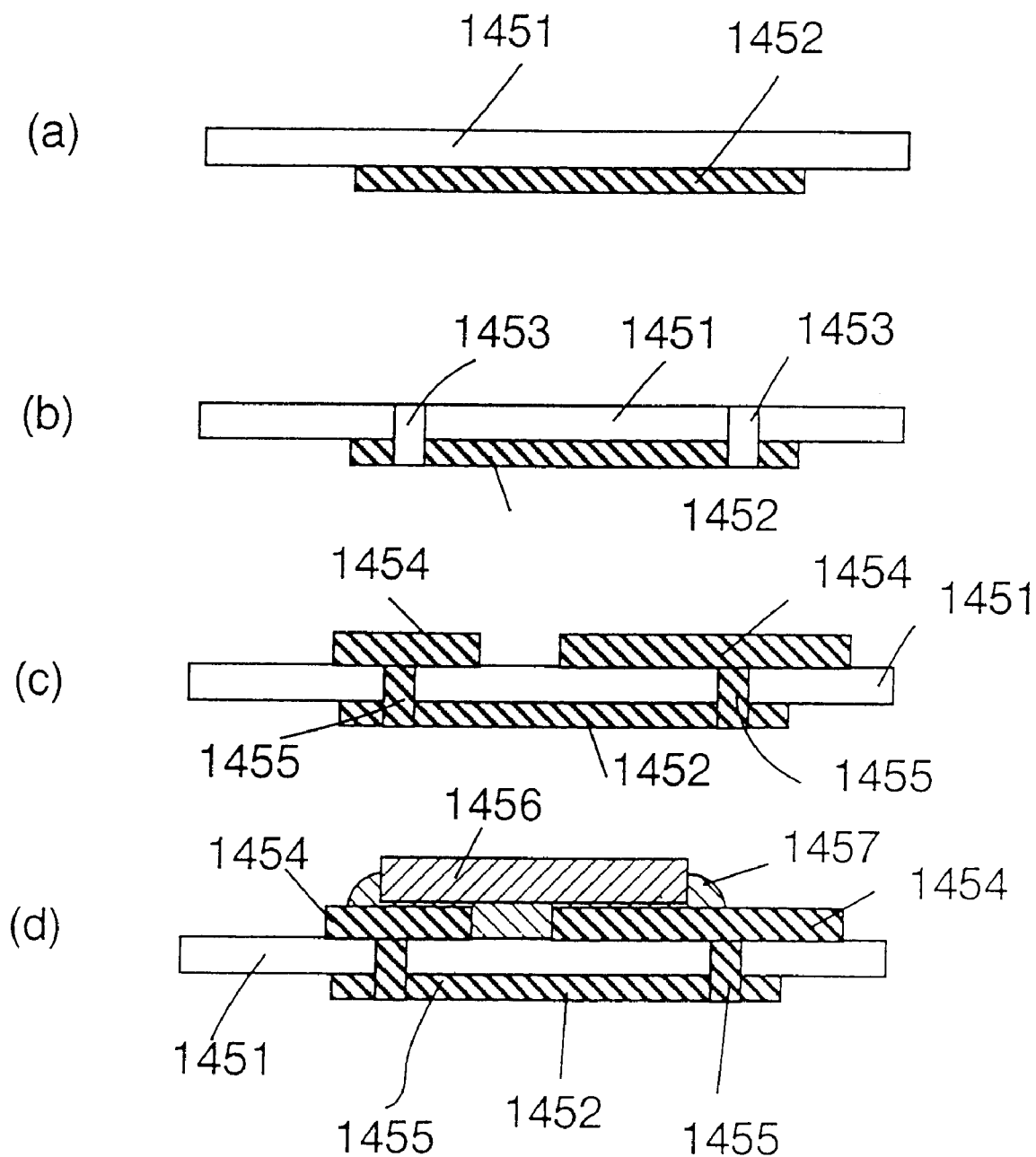
FIGS. 14(a) to 14(d) are sectional views of a principal portion, showing a manufacturing process for a card-like semiconductor device according to the present invention.

FIG. 14 shows a manufacturing process for a card-like semiconductor device according to the present invention. First, as shown in FIG. 14(a), the underside of a flexible substrate 1451 (a PET substrate 50 μm thick) is subjected to screen printing with use a conductive paste to form a conductive pattern 1452 having a thickness of about 20 μm. The conductive pattern 1452 may be formed separately as a back coil portion and a back protective layer portion. Next, as shown in FIG. 14(b), through holes 1453 for connection between the back coil portion and a surface coil are formed with a punch. After a subsequent alignment, a conductive pattern 1454, including the surface coil is printed on the surface of the substrate 1451 with the use of silver paste. The silver paste is buried into the through holes 1453 by thixotropy to afford connecting plugs 1455 (FIG. 14(c)). Thereafter, using an anisotropic conductive adhesive 1457, a thin IC chip 1456 is bonded onto the upper surface of the substrate with upper and lower patterns formed thereon (FIG. 14(d)). Through these steps it is possible to obtain the structure of the semiconductor device shown in FIG. 10.

Figure 15:
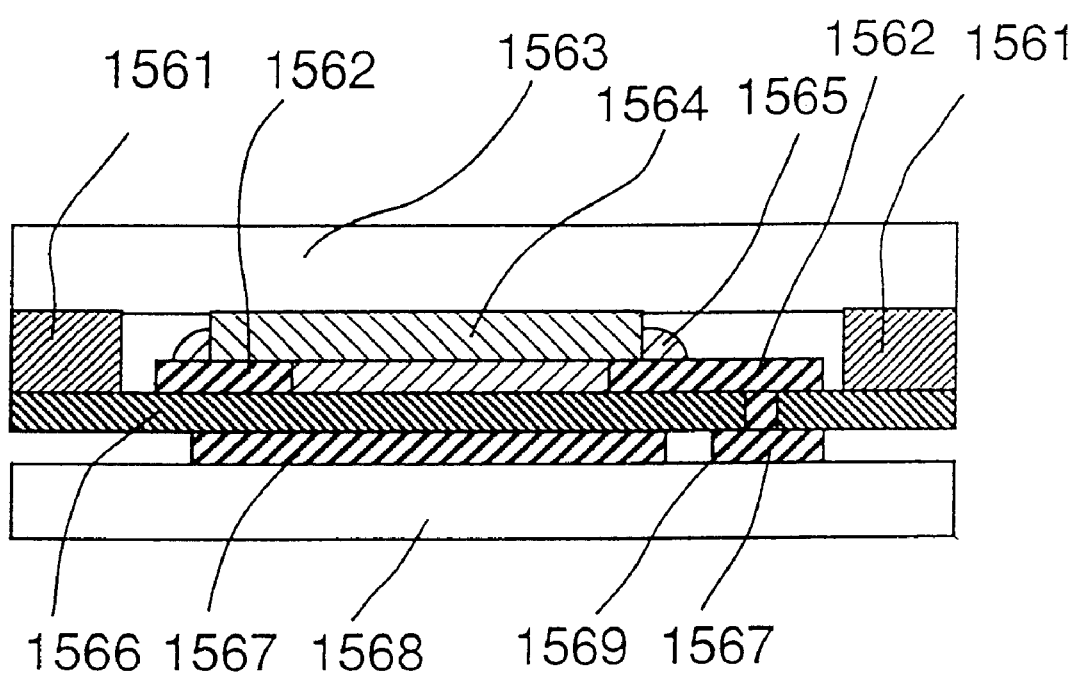
FIG. 15 is a sectional view of a principal portion of a card-like semiconductor device according to the present invention.

Further, by enclosing the semiconductor device with a spacer 1561, an upper cover 1563, and a lower cover 1568, there can be obtained a card-like semiconductor device (FIG. 15). The spacer 1561 is for diminishing the difference in height between a thin IC chip 1564, conductive adhesive 1565, and conductive paste 1562. Also, below the thin substrate 1566, conductive patterns 1567 are formed, which include a back coil portion and a back protective layer portion, using a conductive paste. Numeral 1569 denotes a through hole.

Figure 16:
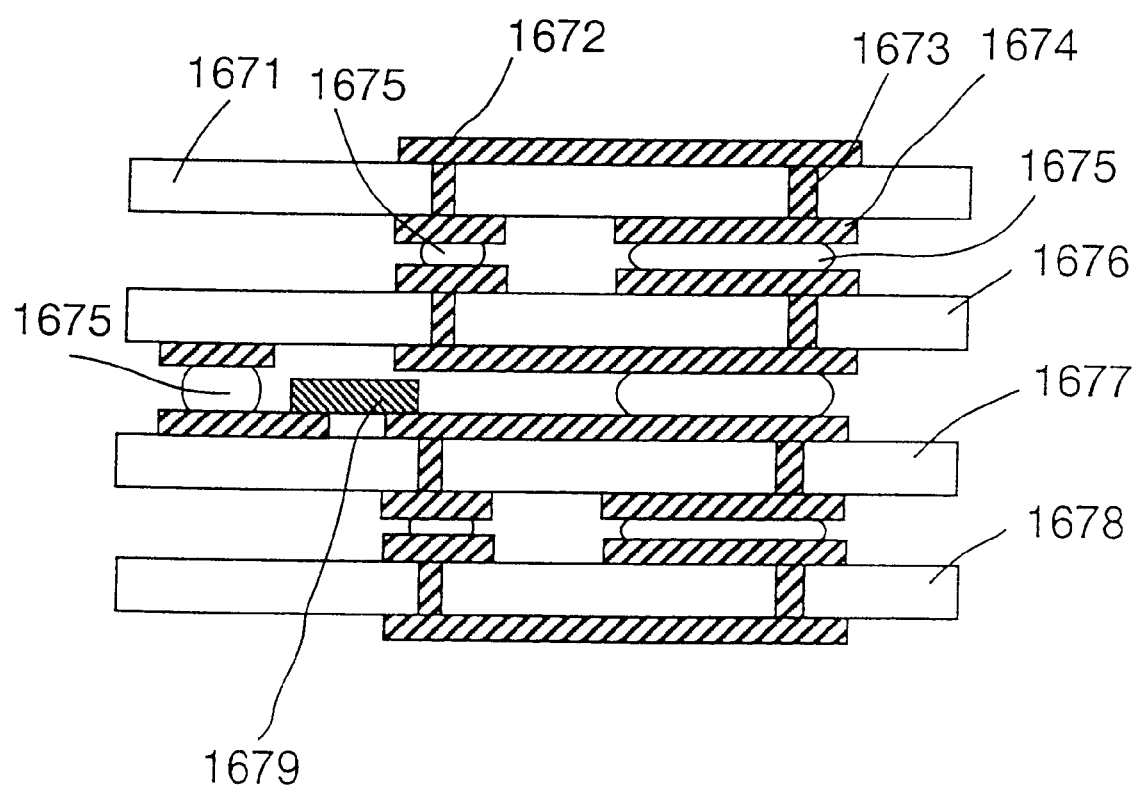
FIG. 16 is a sectional view of a principal portion of a card-like semiconductor device according to the present invention.

It is also possible to obtain a thick semiconductor device having a large number of coil layers. FIG. 16 is a sectional view of a principal portion of such a semiconductor device. In the same figure, a surface pattern 1672 and a back pattern 1674, which are formed, respectively, on the surface and the back of a first substrate 1671, are connected together via through holes 1673. A second substrate 1676, a third substrate 1677, and a fourth substrate 1678 are also formed with patterns on the respective surfaces and backs. These substrates are connected together in a stacked state, for example, in such a manner that the first and second substrates are connected with each other using a conductive adhesive 1675. On the third substrate is mounted a thin IC chip 1679. These components can result in a high-performance, non-contact IC card having high-density and low-resistance coils as an inlet of the card.

Figure 17:
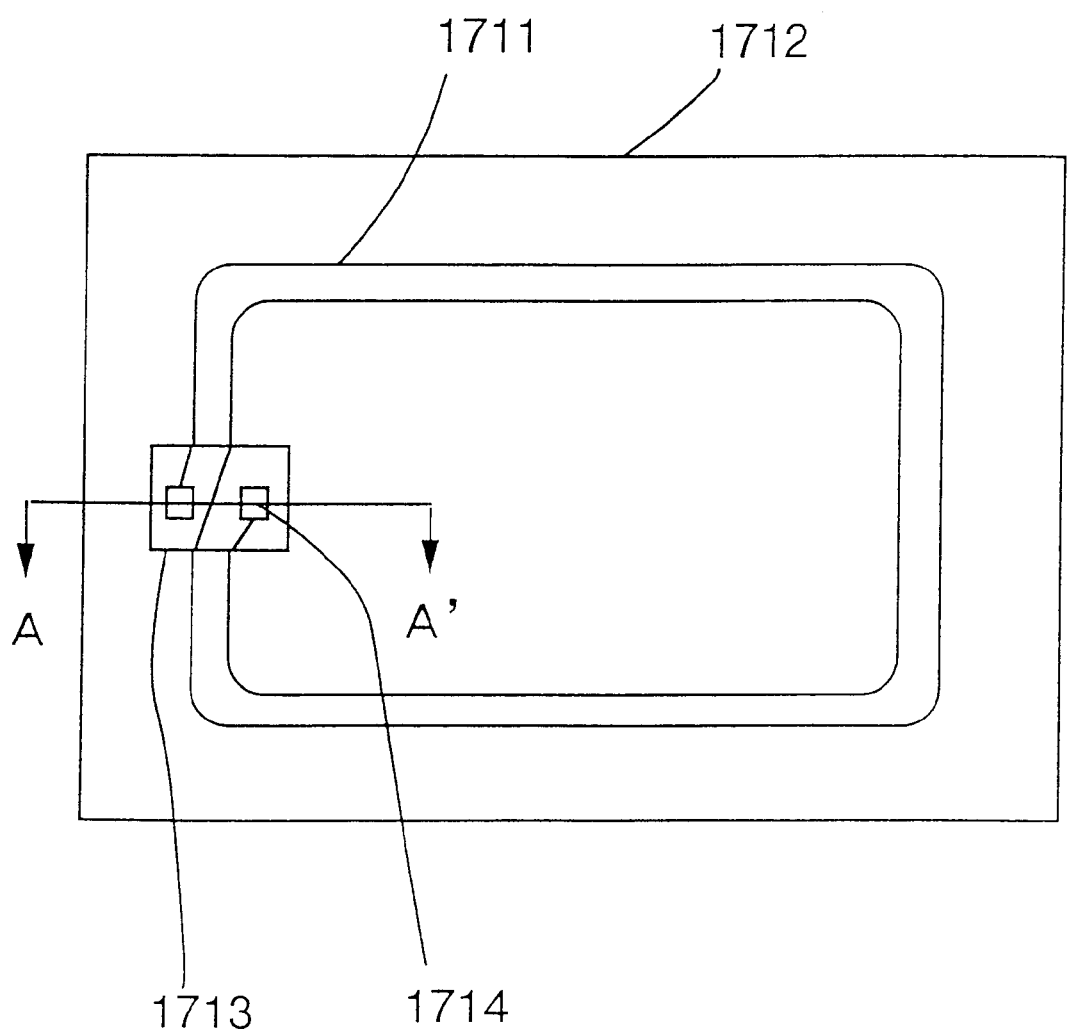
FIG. 17 is a plan view of a card-like semiconductor device according to the present invention.

A proximity type IC card does not require a coil having large inductance. In such a case, as shown in FIG. 17, a coil 1711 which is constituted by a single line may be provided on only one surface side of a substrate 1712 of the IC card. This coil is connected to electrodes 1714 of a thin IC chip 1713.

Figure 18:
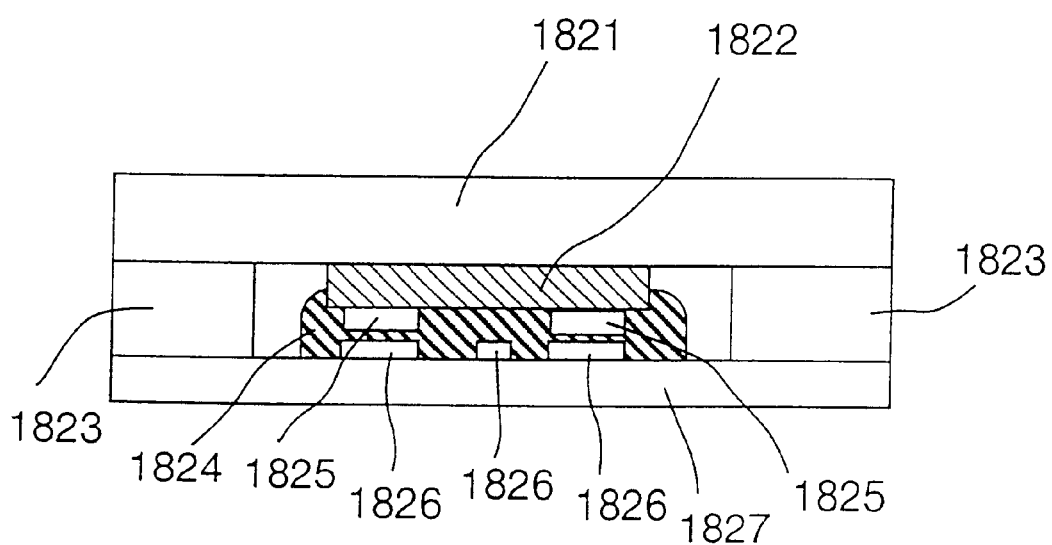
FIG. 18 is a sectional view taken along line A–A' in FIG. 17.

FIG. 18 is a sectional view taken on the line A–A' shown in FIG. 17. In the same figure, the numeral 1822 denotes a thin, flexible IC chip of 0.1 to 110 microns, numeral 1827 denotes a thin substrate, numeral 1824 denotes an anisotropic conductive adhesive, numeral 1826 denotes a substrate-side electrode, numeral 1825 denotes an IC chip-side electrode (external terminal), numeral 1823 denotes a spacer, and the numeral 1821 denotes a cover. The IC chip 1822 is disposed on a neutral surface. Although a lower cover is not provided in this figure, a lower cover may be used for making the IC card thickness into a predetermined thickness.

Figure 19:
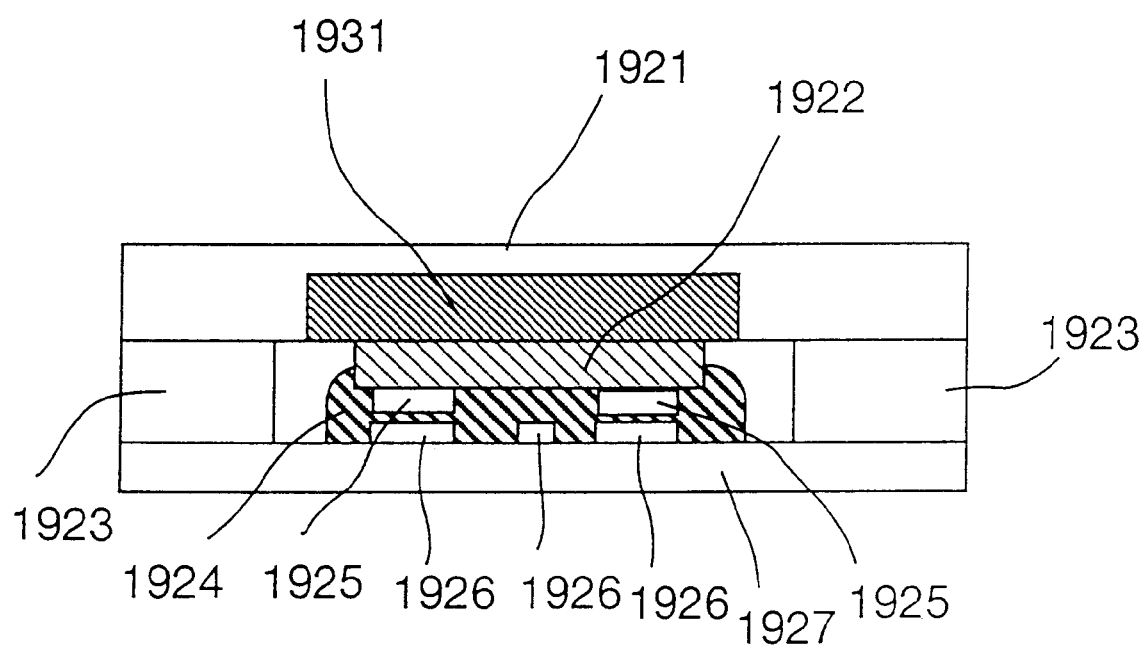
FIG. 19 is a sectional view of a principal portion of a card-like semiconductor device according to the present invention.

FIG. 19 shows an example in which, in the IC card of FIG. 18, a reinforcing plate 1931 is disposed in close contact with the back of the IC chip. In FIG. 19, the numeral 1922 denotes a thin, flexible IC chip of 0.1 to 110 microns, numeral 1927 denotes a thin substrate, numeral 1924 denotes an anisotropic conductive adhesive, numeral 1926 denotes a substrate-side electrode, numeral 1925 denotes a IC chip-side electrode (an external terminal), numeral 1923 denotes a spacer, and the numeral 1921 denotes a cover. The IC chip 1922 is disposed on a neutral surface. A reinforcing layer 1931 formed of a material higher in Young's modulus than the cover 1921 is buried into the same cover. With this reinforcing layer, the cracking of the thin chip caused by a point pressure or a concentrated load is suppressed, whereby it is possible to improve the reliability. Although a lower cover is not provided in this figure, a lower cover may be used to adjust the IC card thickness to a predetermined thickness.

Figure 20:
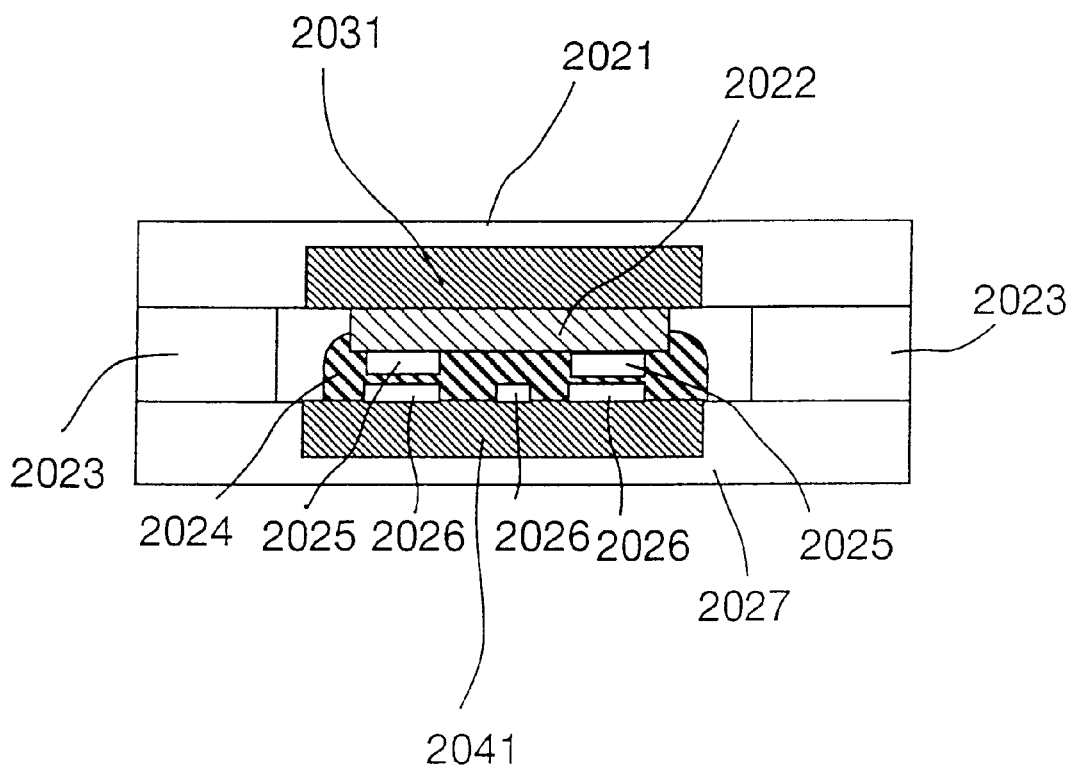
FIG. 20 is a sectional view of a principal portion of card-like semiconductor device according to the present invention.

FIG. 20 shows a structure in which an IC chip is sandwiched between reinforcing layers 2031 and 2041. In the same figure, the numeral 2022 denotes a thin, flexible IC chip of 0.1 to 110 microns, numeral 2027 denotes a thin substrate, numeral 2024 denotes an anisotropic conductive adhesive, numeral 2026 denotes a substrate-side electrode, numeral 2025 denotes an IC chipside electrode (an external terminal), numeral 2023 denotes a spacer, and the numeral 2021 denotes a cover. The IC chip 2022 is disposed on a neutral surface. This configuration permits the mechanical strength to be further enhanced. Buried in the cover 2021 is a reinforcing layer 2031 which is formed of a material higher in Young's modulus than the cover. According to this structure, it is possible to provide a non-contact IC card at a low cost in which the thin chip is unlikely to be cracked by a point pressure or a concentrated load. Further, a sufficiently high mechanical strength is attained because of a buried reinforcing layer 2041 which is formed of a material higher in Young's modulus than the thin substrate 2027.

Also, in the structure wherein coil patterns are formed on both sides of a thin substrate, reinforcing layers can be provided on both upper and lower sides of an IC chip.

Figure 21:
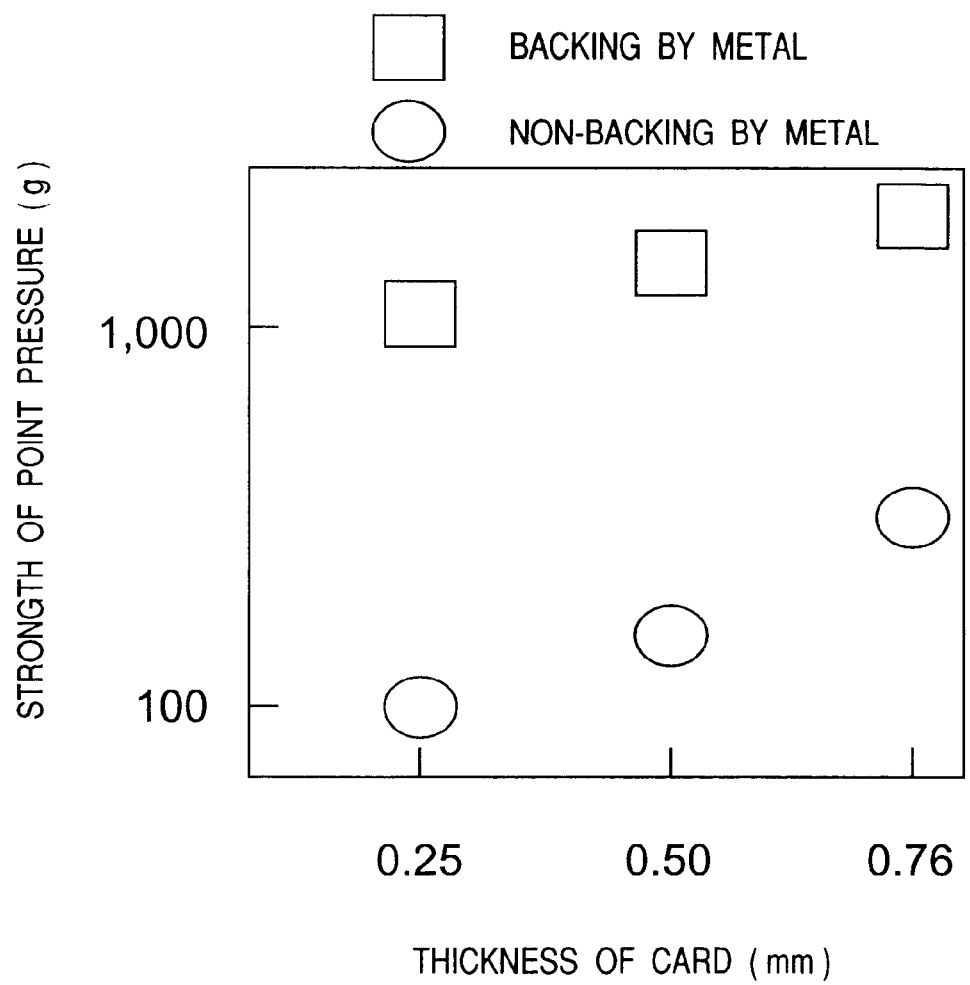
FIG. 21 is a diagram showing the effect of a reinforcing plate.

FIG. 21 shows data on the strength of a point pressure measured with tungsten placed near a thin IC chip, the tungsten having a high Young's modulus. From the same figure, it is seen that the mechanical strength against a point pressure is improved.

Figure 22:
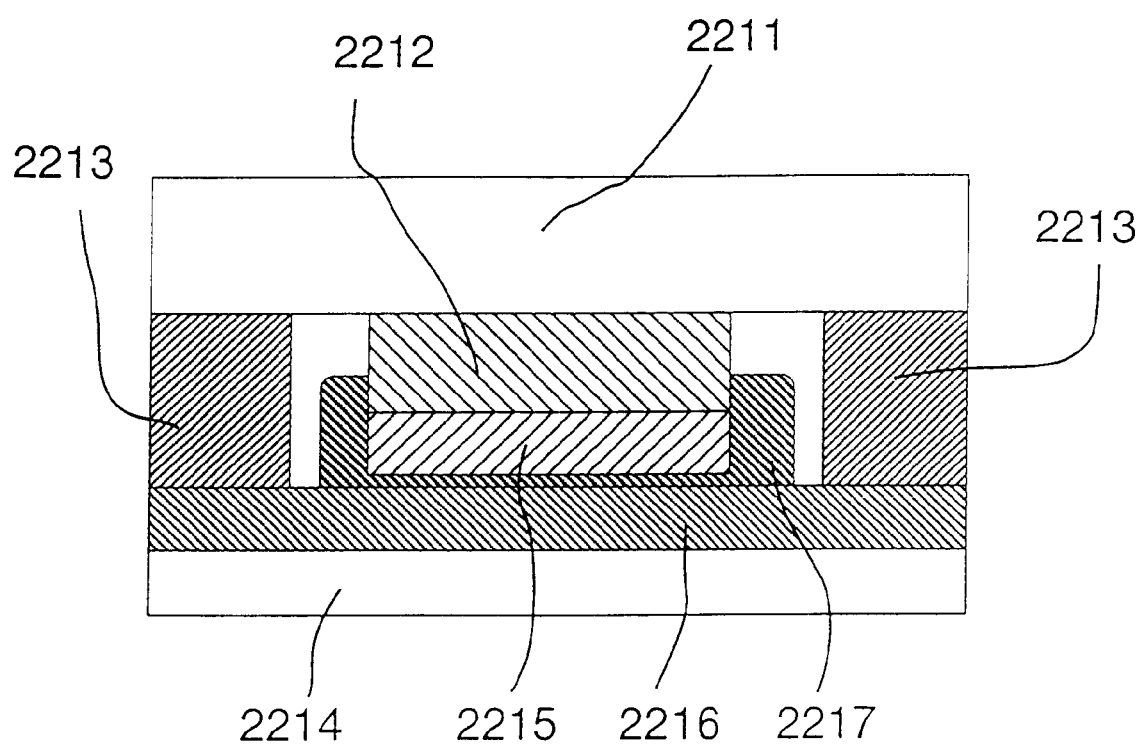
FIG. 22 is a sectional view of a principal portion of a card-like semiconductor device according to the present invention.

FIG. 22 shows an example in which a reinforcing plate having about the same size as an IC chip is used. In this example, a thin IC chip 2215 is backed with a reinforcing plate 2212 of about the same size (within several %) as the IC chip, and the reinforcing plate 2212 is formed of a material higher in Young's modulus than a cover sheet 2211. Using a conductive adhesive 2217, an external terminal of the IC chip 2215 is connected to an electrode formed on a thin substrate 2216 (external terminal and electrode are not shown). The IC chip 2215 and the reinforcing plate 2212, together with a spacer 2213 disposed around them, are laminated in a sandwiched fashion to both a lower sheet 2214 and a cover sheet 2211. In this way, an IC card can be obtained having a high compressive strength.

Figure 23:
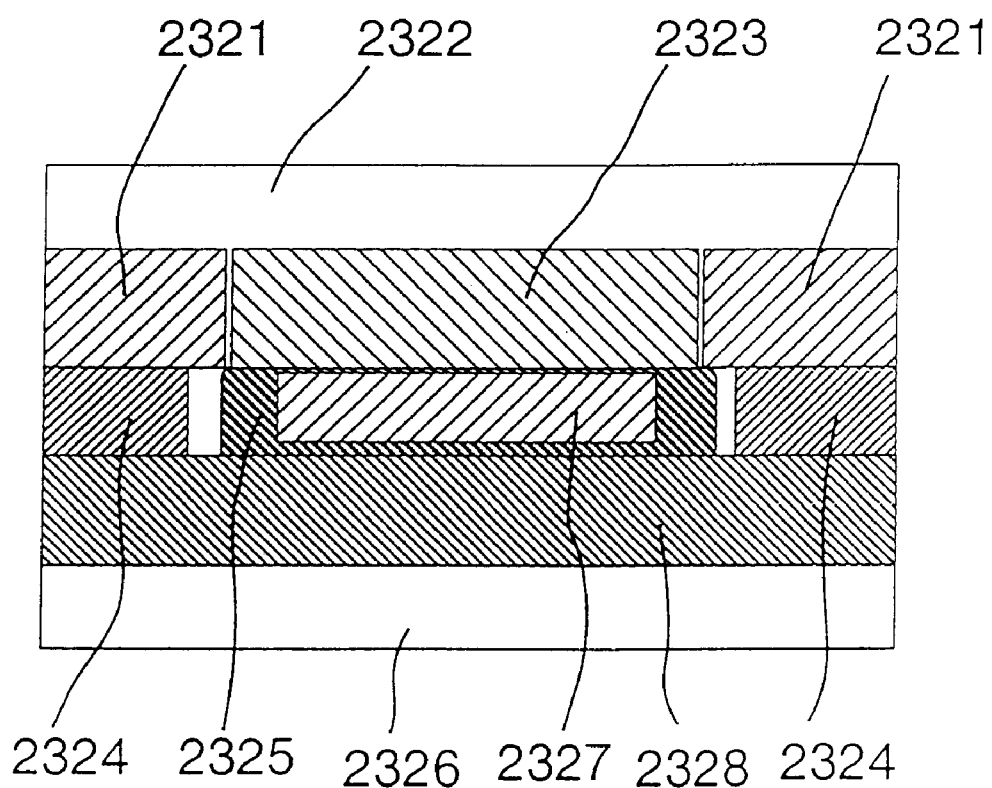
FIG. 23 is a sectional view of a principal portion of a card-like semiconductor device according to the present invention.

FIG. 23 shows an example in which the separate spacers 2321 and 2324 are disposed for a reinforcing plate 2323 and an IC chip 2327, respectively. The structure illustrated in the same figure permits easy planarization of an IC card. In the same figure, the numeral 2322 denotes an upper cover sheet, numeral 2325 denotes an anisotropic conductive adhesive, numeral 2326 denotes a lower cover, and the numeral 2328 denotes a thin substrate. The upper cover sheet 2322 has a larger size than the IC chip 2327, which is thin, and is disposed so as to cover the IC chip. The IC chip is laminated together with the substrate 2328, lower cover 2326, and spacer 2324 to afford a thin IC card highly resistive to a point pressure, having a flat surface and a thickness of 100 to 760 microns.

Figure 24:
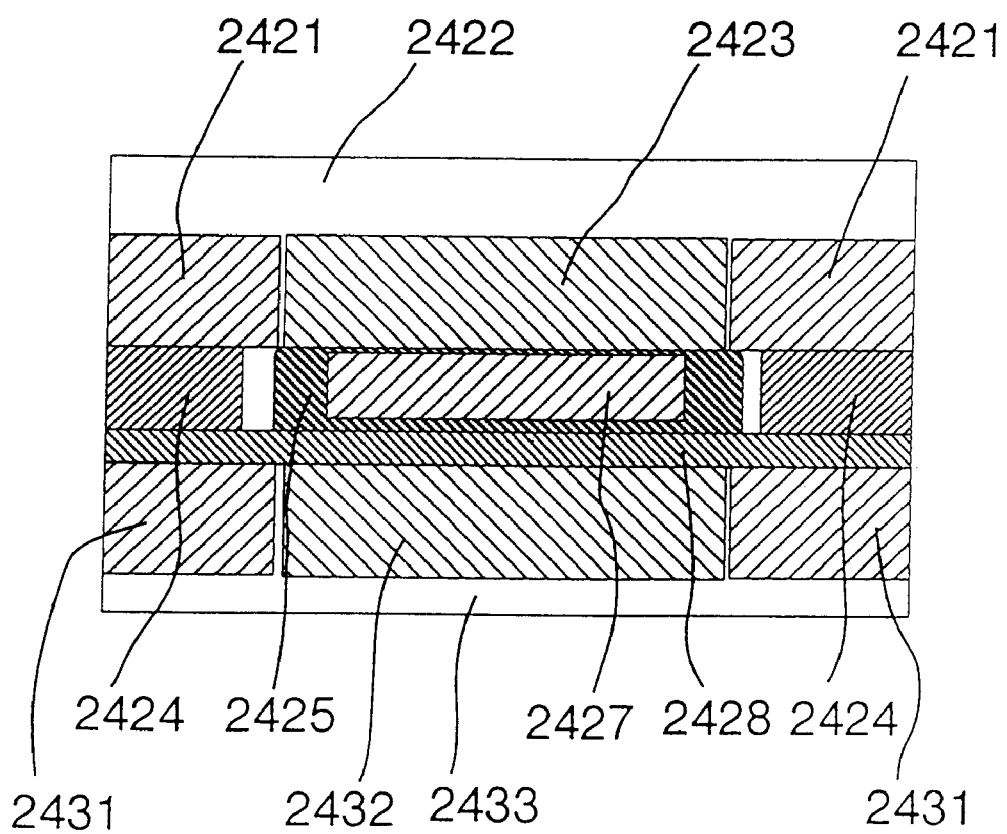
FIG. 24 is a sectional view of a principal portion of a card-like semiconductor device according to the present invention.

FIG. 24 shows an example in which an IC chip 2427 is sandwiched in between two reinforcing plates, 2423 and 2432, and spacers 2421, 2431, and 2424 are disposed for the reinforcing plates and the IC chip. In the same figure, the numeral 2422 denotes one cover sheet, numeral 2433 denotes the other cover sheet, numeral 2425 denotes an anisotropic conductive adhesive, and the numeral 2428 denotes a thin substrate. The reinforcing plates 2423 and 2432 are formed of a material higher in Young's modulus than the cover sheets 2433 and 2422, and can withstand a bad environment against a mechanical stress. The thin IC chip itself is stably bonded to the thin substrate 2428 with the conductive adhesive 2425. The surface of the resulting IC card is planarized by the spacers 2421, 2424, and 2431. Even when a bending stress is applied to the IC card, it is possible to diminish the stress imposed on the IC chip. Since spacers are used for each of the reinforcing plates and the IC chip, the constituent layers may be formed separately and then laminated together, which is suitable for mass production.

In the case where the IC chip and reinforcing plate used are thin (50 microns or less), the spacers can be omitted by adjusting the thickness of the adhesive.

Figure 25:
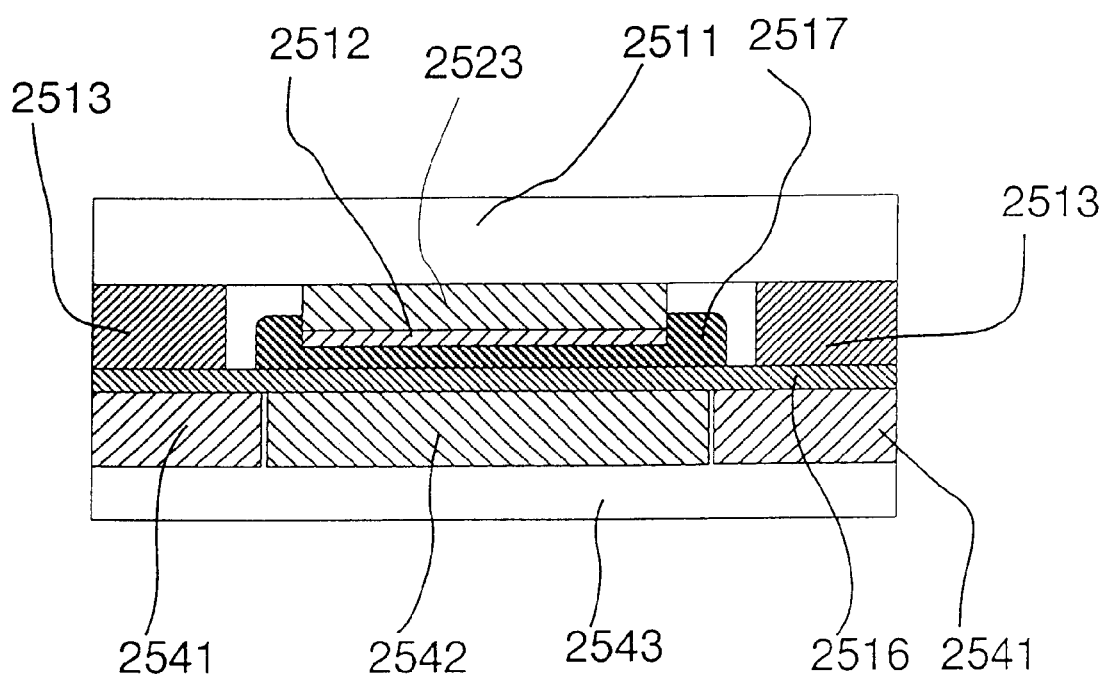
FIG. 25 is a sectional view of a principal portion of a card-like semiconductor device according to the present invention.

FIG. 25 shows an example in which a reinforcing plate 2542 and a spacer 2541 are added to the structure shown in FIG. 22. In FIG. 25, the numeral 2511 denotes one cover sheet, numeral 2543 denotes the other cover sheet, numeral 2512 denotes an IC chip, numeral 2523 denotes a reinforcing plate attached to the back of the IC chip, numeral 2513 denotes a spacer, numeral 2516 denotes a thin substrate, and the numeral 2517 denotes an anisotropic conductive adhesive. The reinforcing plate 2542 is formed of a material higher in Young's modulus than an upper sheet 2511 and a lower sheet 2543. The surface of the IC card is planarized by the spacers 2541 and 2513. The thin IC chip 2512 is backed with the reinforcing plate 2523 which is formed of a material having a high Young's modulus, and is mounted on the substrate 2516 which is flexible and thinner than the thin IC chip 2512. This structure permits a stable production of a highly reliable IC card which is strong against a point pressure.

Figure 26:
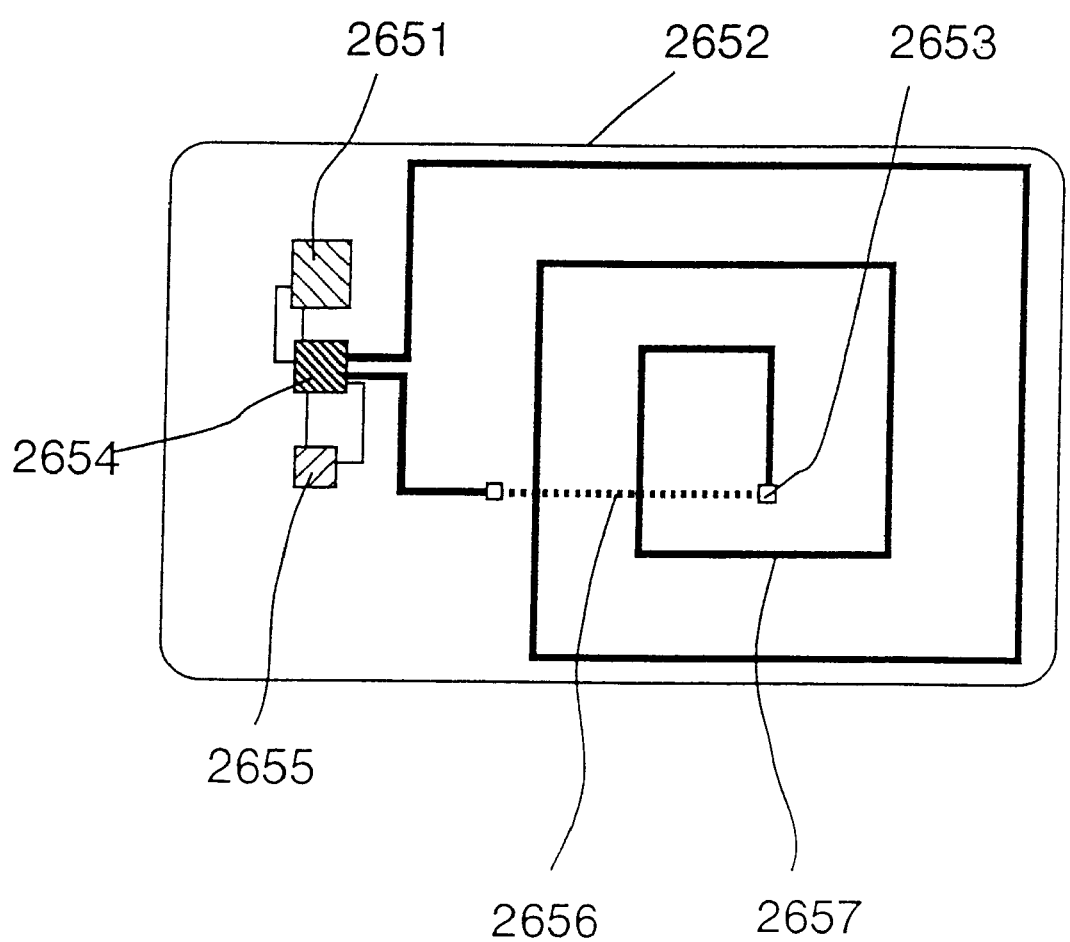
FIG. 26 is a plan view of a card-like semiconductor device according to the present invention.

FIG. 26 shows an example of the plane structure of the IC cards illustrated in FIGS. 22 to 25. A microprocessor chip 2651, a transceiver chip 2654, and a capacitor chip 2655, which have been made as thin as 50 $\mu$m or so, are mounted on an IC card substrate 2652. These are electrically connected with one another. The transceiver chip 2654 is connected to a conductive pattern 2657 (including a coil portion), which is formed on the surface side of a thin substrate by screen printing. The conductive pattern 2657 is connected through a through hole 2653 to a conductive pattern 2656, which is formed on the back side of the thin substrate. Although the back-side conductive pattern is illustrated using a straight line, it may be formed in a coil shape, whereby it is possible to handle a weaker signal and also possible to extend the distance of a remote operation.

The following description is now provided showing how to fabricate a card-like semiconductor device according to the present invention. This method permits a less expensive fabrication of the semiconductor device.

Figure 27:
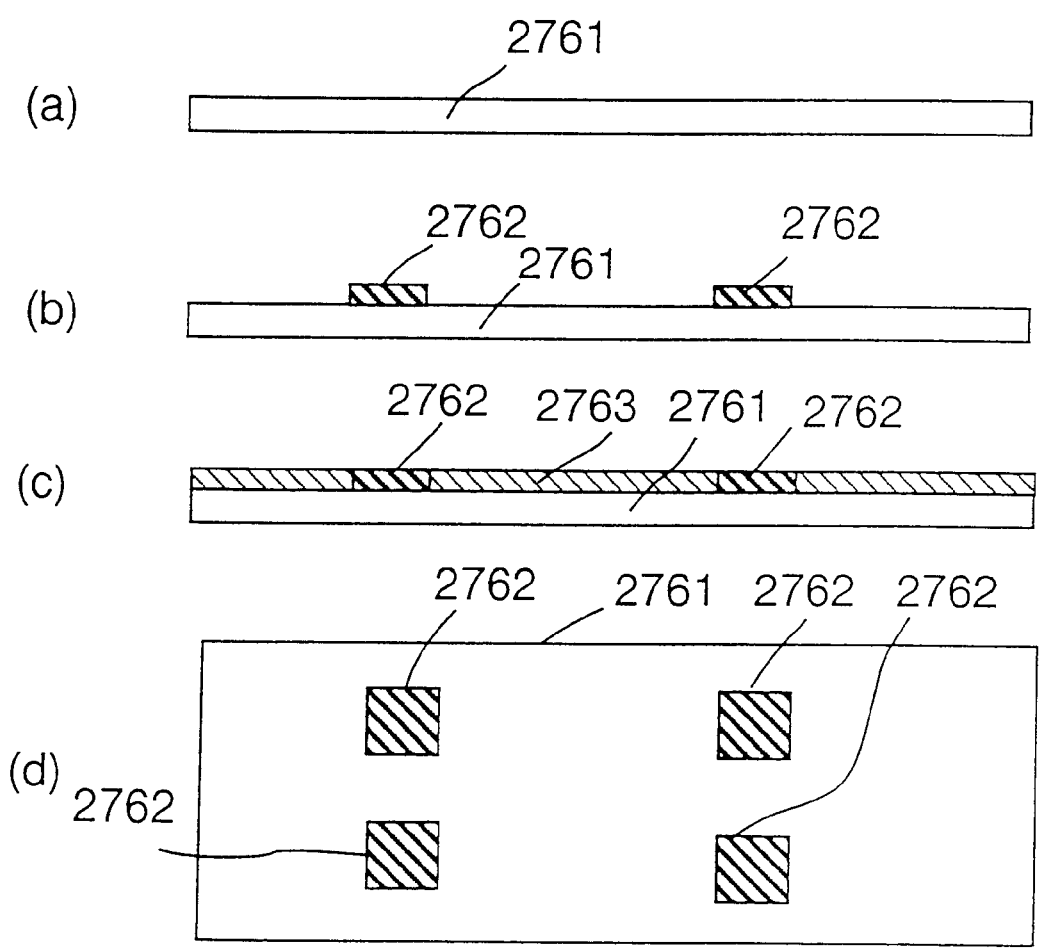
FIGS. 27(a) to 27(d) are diagrams showing the process of forming a reinforcing plate according to the present invention.

FIGS. 27(*a*) to 27(*c*) are sectional views showing a process of mounting (backing by metal) reinforcing plates to a cover sheet, and FIG. 27(*d*) is a plan view of the sheet after the mounting of the reinforcing plates. In these figures, the numeral 2761 denotes a cover sheet, for which PET is employable, numeral 2762 denotes a reinforcing plate, for which tungsten or stainless steel are employable, and the numeral 2763 denotes a sheet-like spacer.

First, a thin sheet 2761 is provided (FIG. 27(*a*)). Next, reinforcing plates (several millimeters square) are attached to the thin sheet (FIG. 27(*b*)). The thickness of each reinforcing plate is in the range from 1 to 110 microns, and is preferably about the same as the thickness of a thin IC chip. Thereafter, as shown in FIG. 27(*c*), a spacer sheet 2763 having apertures formed correspondingly to the positions of the reinforcing plates is affixed to the thin sheet 2761. FIG. 27(*d*) is a plan view of the sheet shown in FIG. 27(*c*). In this way, a cover sheet with reinforcing plates can be easily fabricated.

Figure 28:
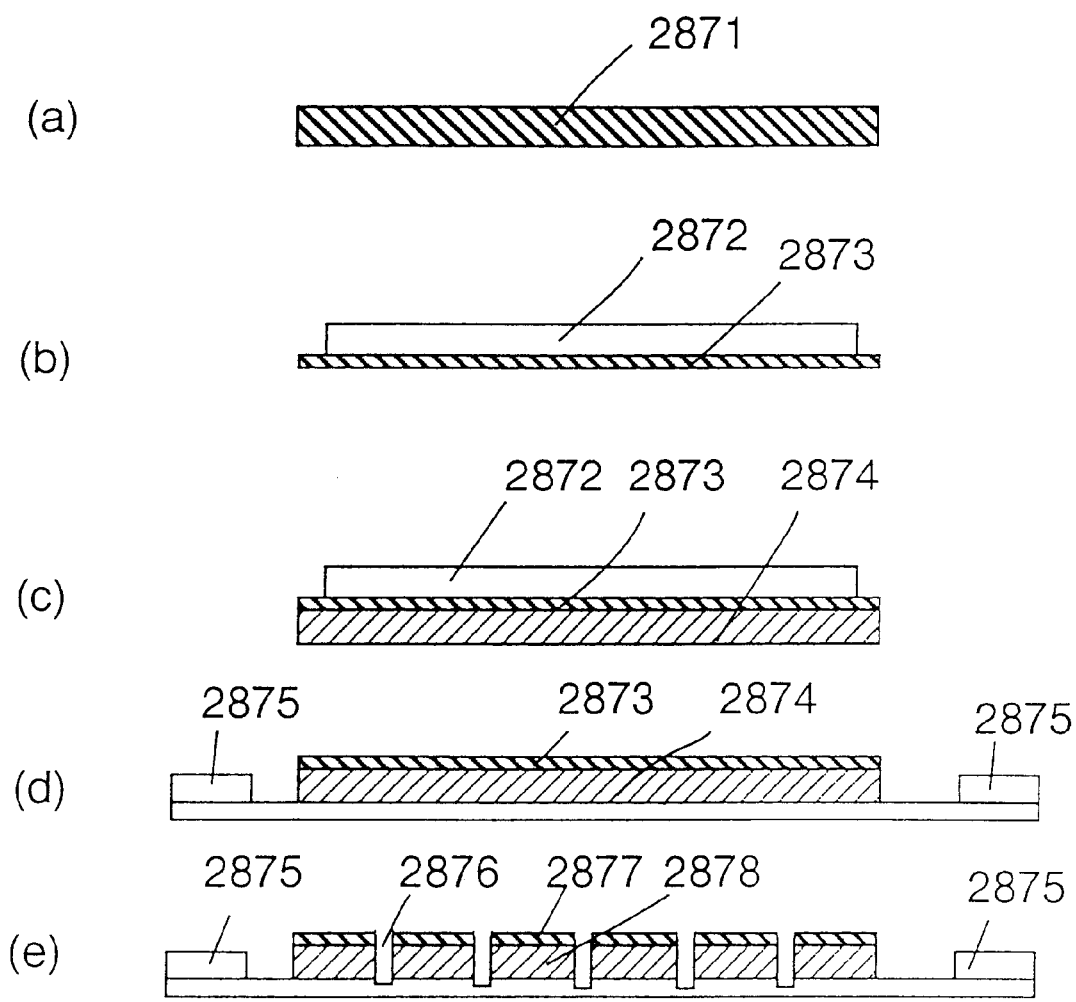
FIGS. 28(a) to 28(e) are sectional views showing the process of cutting out an IC chip from a semiconductor wafer.

FIGS. 28(*a*) to 28(*e*) illustrate how to fabricate an IC chip provided with the reinforcing plate 2212, shown in FIG. 22.

First, a wafer 2871 having a large number of IC chips formed thereon is provided (FIG. 28(*a*)). Next, a support sheet 2872 is affixed to the main surface side of the wafer, and the back of the wafer is removed by a spin etching system to make a wafer 2873 as thin as 1 to 110 microns (FIG. 28(b)). Then, a metal plate 2874 of about the same size as the wafer is affixed to the back of the thinned wafer (FIG. 28(c)). Next, the wafer with the metal plate is affixed to a dicing tape having frames 2875, and the support sheet is removed (FIG. 28(d)). By subsequent formation of dicing grooves 2876, as shown in FIG. 28(e), thin chip 2877 is completed having a thin backing metal 2878. In this way, thin metal-backed chips can be mass-produced efficiently.

Where the IC chip and reinforcing plate used are thin (about 50 μm or less as the total thickness), the use of spacers may be omitted. An example of a method for fabricating an IC card without using spacers will be described below with reference to FIGS. 50(a) to 50(d). In these figures, the numeral 5001 denotes a conductive pattern, numeral 5002 denotes a card substrate, numeral 5003 denotes a thin chip, numeral 5004 denotes a reinforcing plate, numeral 5005 denotes a cover sheet, and the numeral 5006 denotes an adhesive.

First, conductive patterns 5001 are formed on a card substrate 5002 (FIG. 50(a)). Next, external terminals formed on one side of a thin chip and conductive patterns are connected together using an anisotropic conductive adhesive (not shown) (FIG. 50(b)). Then, a reinforcing plate 5004 is mounted on the opposite side of the thin chip (FIG. 50(c)). The thin chip and the reinforcing plate are fixed together using a bubble separation film. Thereafter, a cover sheet 5005 is bonded to the card substrate 5002 using an adhesive 5006 (FIG. 50(d)). According to this method, the simplification of the structure and the reduction of manufacturing cost can be attained.

Although in the above method the cover sheet is provided on only one side of the card substrate, it may also be provided on the opposite side of the card substrate where required (for example, for disposing the thin chip on a neutral surface of a card-like semiconductor device or for protecting one of the conductive patterns if formed on both sides of the card substrate).

The semiconductor device of the illustrated structure can be mass-produced by the method shown in FIG. 49, using the substrate sheet with the thin chip and the reinforcing plate mounted thereon, as well as the cover sheet, or using the substrate sheet with the thin chip mounted thereon and the cover sheet with the reinforcing plate mounted thereon.

Figure 29:
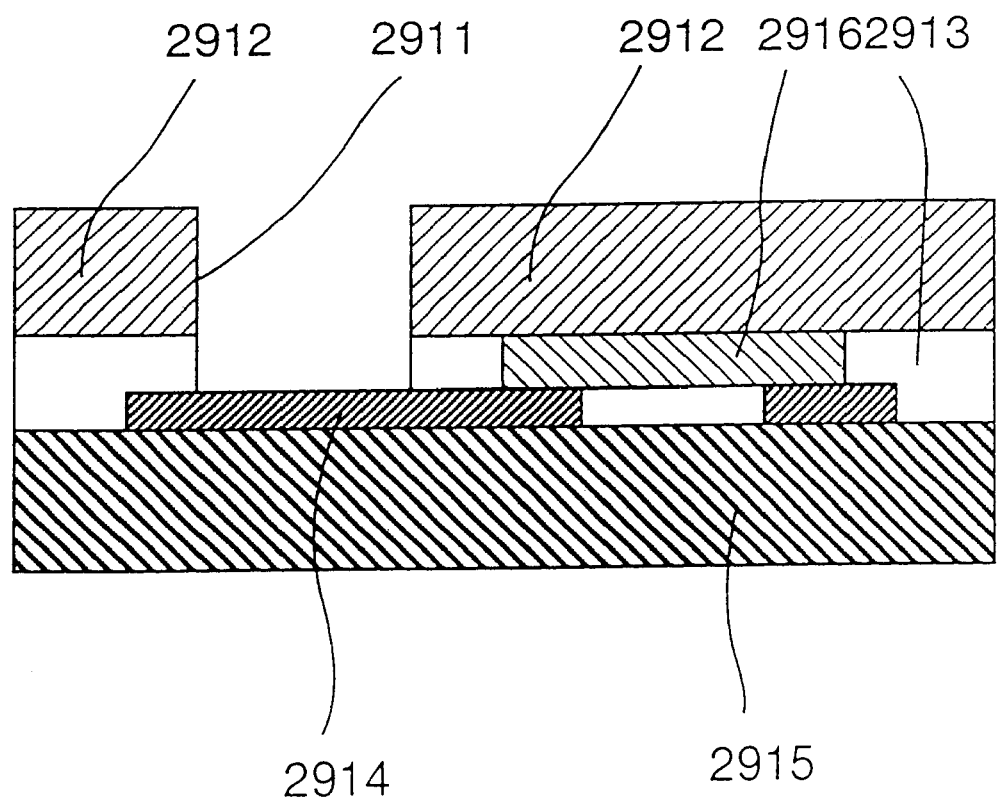
FIG. 29 is a sectional view of a principal portion of a card-like semiconductor device according to the present invention.

FIG. 29 shows a semiconductor device wherein a conductive pattern 2914, formed on a thin substrate 2915 is exposed. In the same figure, the numeral 2912 denotes an upper cover sheet, numeral 2911 denotes an aperture formed in the upper cover sheet, numeral 2913 denotes an adhesive, and the numeral 2916 denotes a semiconductor chip. On the thin substrate 2915, which is located on the lower side, a conductive pattern 2914 is formed, with an external terminal (not shown) of the semiconductor chip being connected to the conductive pattern 2914 using an anisotropic conductive adhesive (not shown). The upper cover sheet 2912 has an aperture 2911, to which the conductive pattern is exposed, and is bonded to the underlying thin substrate 2915 with an adhesive 2913. With such a simple structure, it is possible to fabricate a highly reliable, contact type IC card at a low cost.

Figure 30:
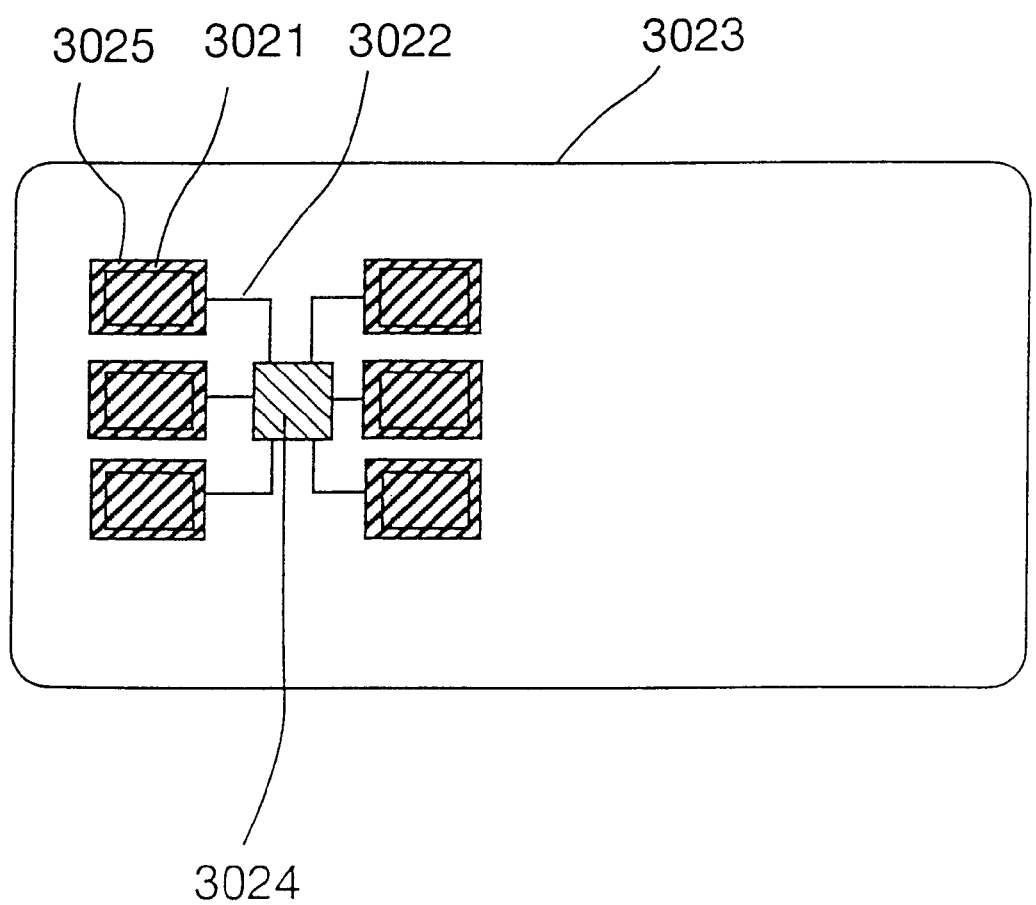
FIG. 30 is a plan view of a card-like semiconductor device according to the present invention.
Figure 31:
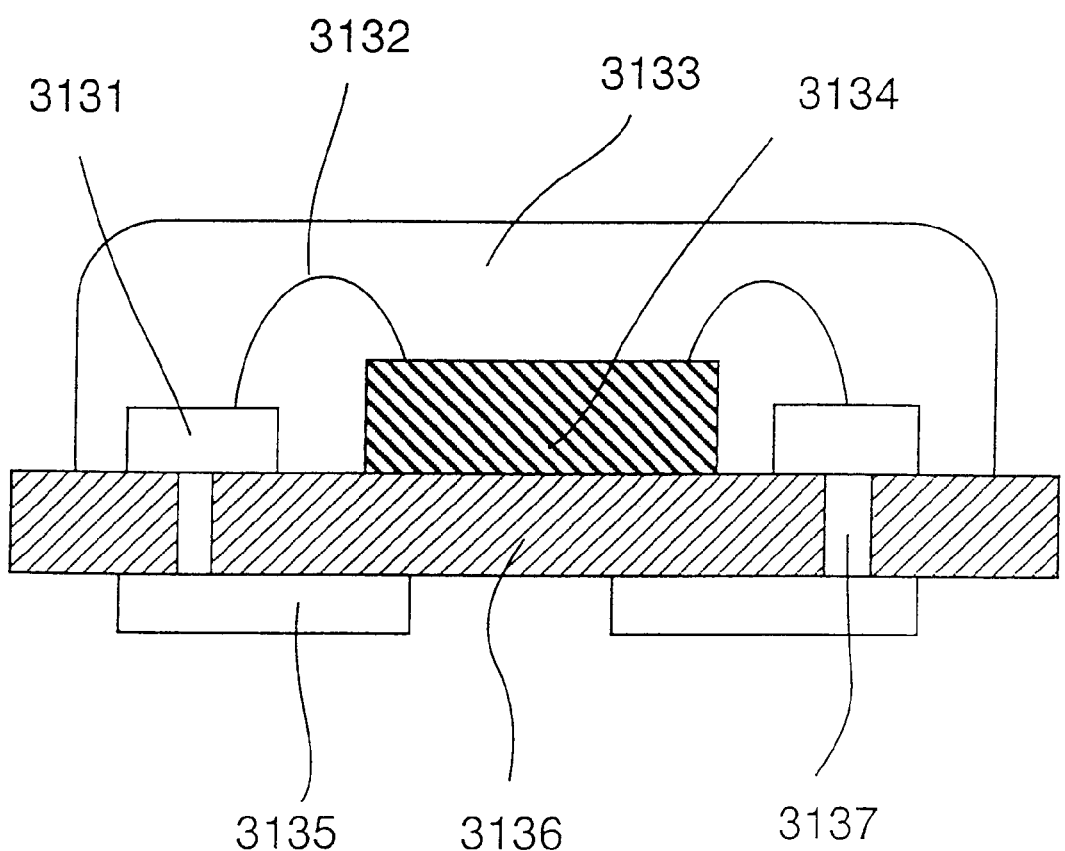
FIG. 31 is a sectional view of a principal portion of a conventional IC card.

FIG. 30 is a plan view showing an example of a semiconductor device having the structure illustrated in FIG. 29, in which the conductive pattern is exposed. In FIG. 30, the numeral 3021 denotes an aperture formed in a cover sheet, numeral 3025 denotes a conductive pattern area exposed to the aperture, numeral 3024 denotes a semiconductor chip, numeral 3022 denotes a conductive pattern which constitutes the wiring for a connection between the conductive pattern area 3025 and a semiconductor chip 3024, and the numeral 3023 denotes an IC card.

Apertures 3021 are formed in the cover sheet so that exposed conductive pattern areas 3025 can contact the opening portions respectively from the exterior, respectively. Wiring patterns 3022 are connected to the semiconductor chip 3024 through electrodes. This structure can afford a contact type IC card.

Figure 32:
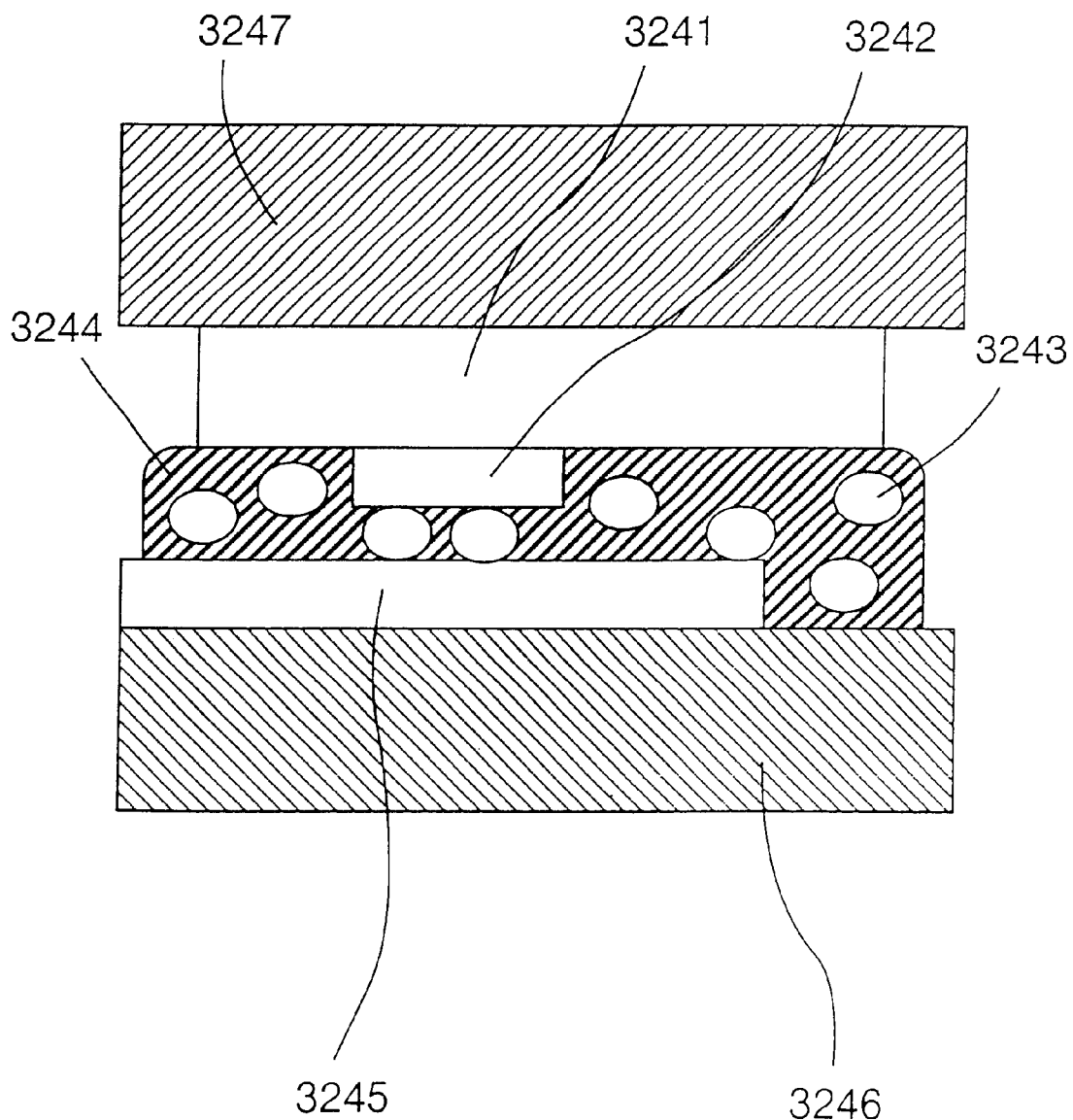
FIG. 32 is a sectional view of a principal portion of a card-like semiconductor device according to the present invention.

FIG. 32 shows an example of a connection structure between external terminals of a semiconductor chip and electrode portions of conductive patterns formed on a thin substrate.

Each pad 3242 (external terminal) formed on the surface of a semiconductor chip 3241 is connected to a substrate pattern 3245 formed on the surface of a thin substrate 3246, using an adhesive 3244 (an anisotropic conductive adhesive) which contains the conductive particles 3243. The semiconductor chip 3241 is covered with a cover sheet 3247. The conductive particles are formed using gold and have a size of 5 to 10 microns. The use of an anisotropic conductive adhesive makes wire bonding unnecessary and permits the reduction in thickness and in the number of manufacturing steps.

Figure 33:
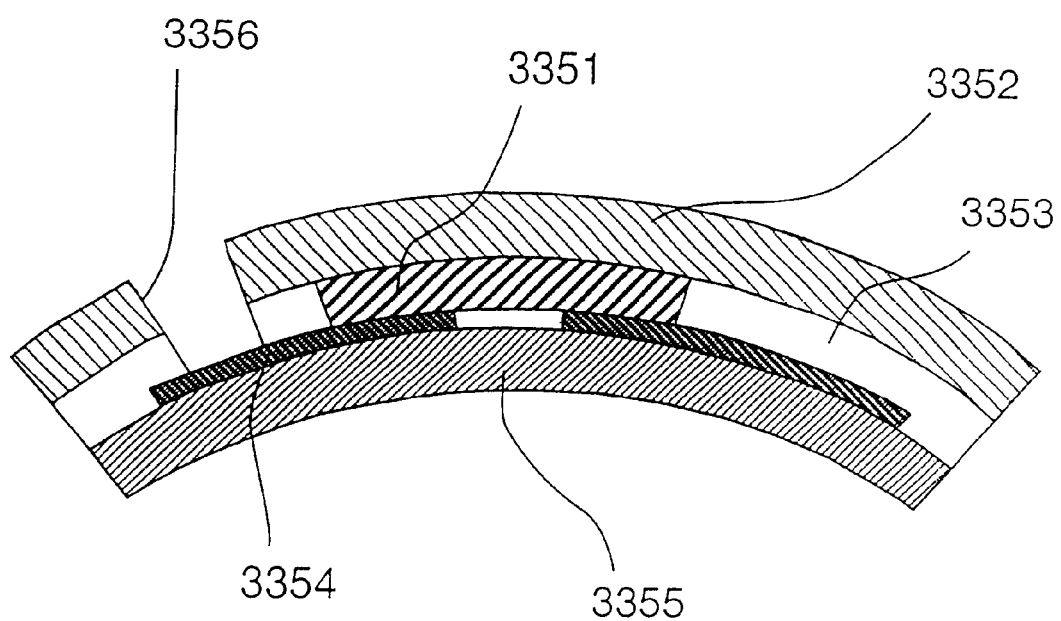
FIG. 33 is a sectional view of a principal portion of a card-like semiconductor device according to the present invention, in a ease in which the device is in a bent state.

FIG. 33 is a sectional view of a principal portion of the semiconductor device shown in FIG. 29, which is in a bent state. In FIG. 33, the numeral 3351 denotes a semiconductor chip, numeral 3352 denotes a cover sheet, numeral 3353 denotes an adhesive, numeral 3354 denotes a conductive pattern, numeral 3355 denotes a thin substrate, and the numeral 3356 denotes an aperture.

The semiconductor chip 3351 is connected to the conductive pattern 3354 and is covered with the cover sheet 3352 having the aperture 3356. By setting the thickness of the semiconductor device at 300 microns or less, it is possible to provide a contact type IC card capable of being bent.

Besides, if the card substrate is provided with a magnetic tape, it is possible to provide an IC card which also serves as the conventional magnetic card. Moreover, by constituting this semiconductor chip as a once-write type memory, the memory size become about half of E2PROM, and it is easy to ensure security.

Figure 34:
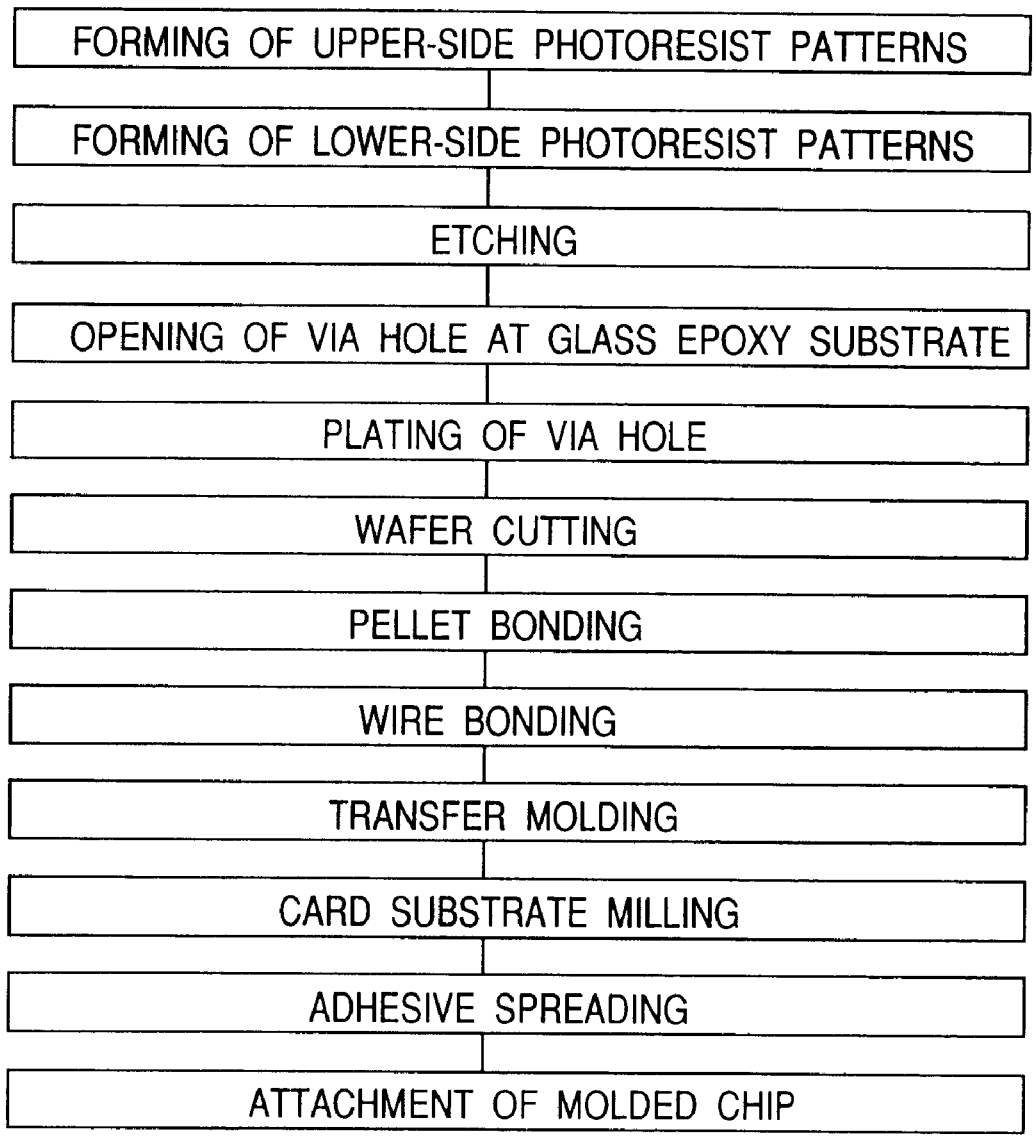
FIG. 34 is a flow chart showing the main manufacturing steps for a conventional IC card.
Figure 35:
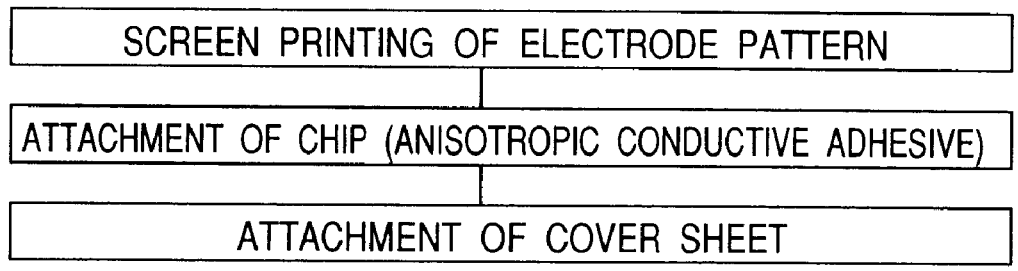
FIG. 35 is a flow chart showing the main manufacturing steps for a card-like semiconductor device according to the present invention.

FIG. 35 is a flow chart showing an IC card fabricating method according to the present invention. The formation of upper- and lower-side photoresist patterns in the flow of FIG. 34 can be done by electrode pattern screen printing. Moreover, the conventional two steps of pellet bonding and wire bonding can be substituted with a single step of chip bonding which uses an anisotropic conductive film.

Further, since the conventional steps of transfer molding, card substrate milling, adhesive spreading, and attachment of a molded chip can be done in a cover sheet attachment step involving sandwiching an IC chip, the manufacturing process is simplified and it is possible to fabricate an IC card at a low cost.

Figure 36:
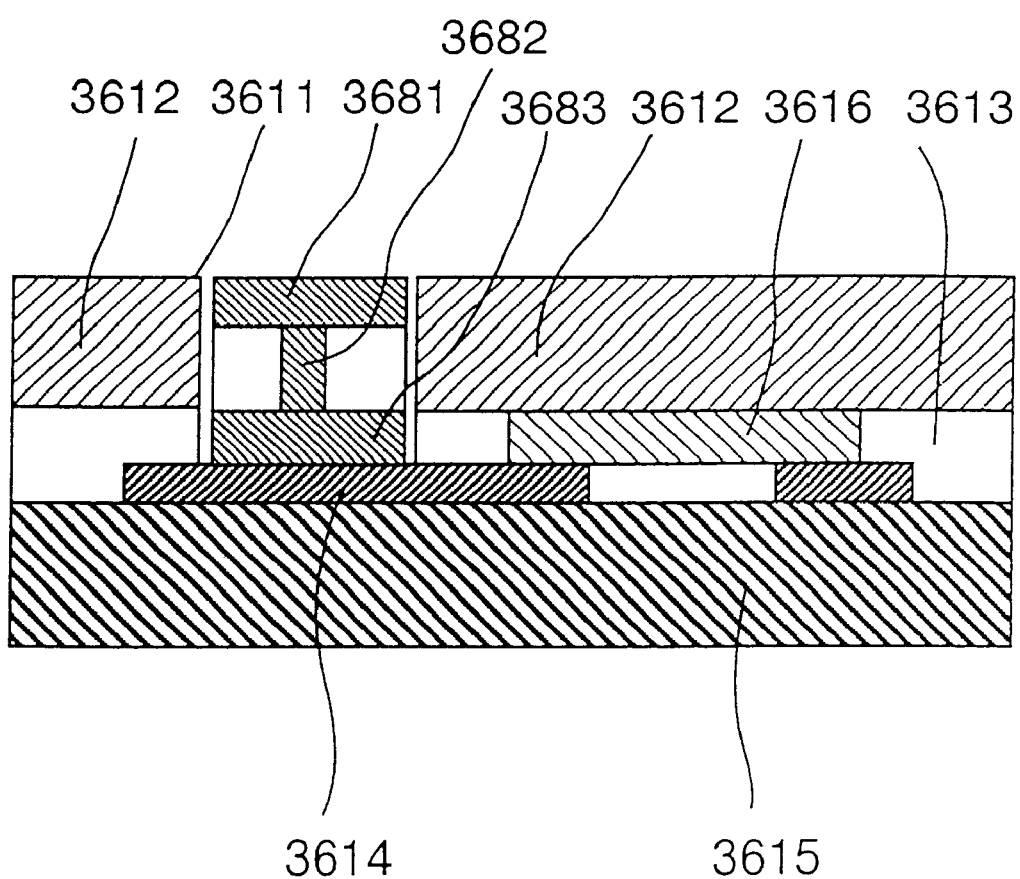
FIG. 36 is a sectional view of a principal portion of a card-like semiconductor device according to the present invention.

FIG. 36 shows an example in which the structure of an aperture in the semiconductor device shown in FIG. 29 is improved. More specifically, a substrate comprising a contact electrode 3681 and an electrode 3683, connected together through a through conductor 3682, is buried in an aperture 3611 and is connected to a conductive pattern 3614 using an anisotropic conductive adhesive, for example. According to this structure, it is possible to improve the flatness of the contact portion and the contact reliability. In FIG. 36, the numeral 3612 denotes a cover sheet, numeral 3613 denotes an adhesive, numeral 3615 denotes a thin substrate, and the numeral 3616 denotes a semiconductor chip.

Figure 37:
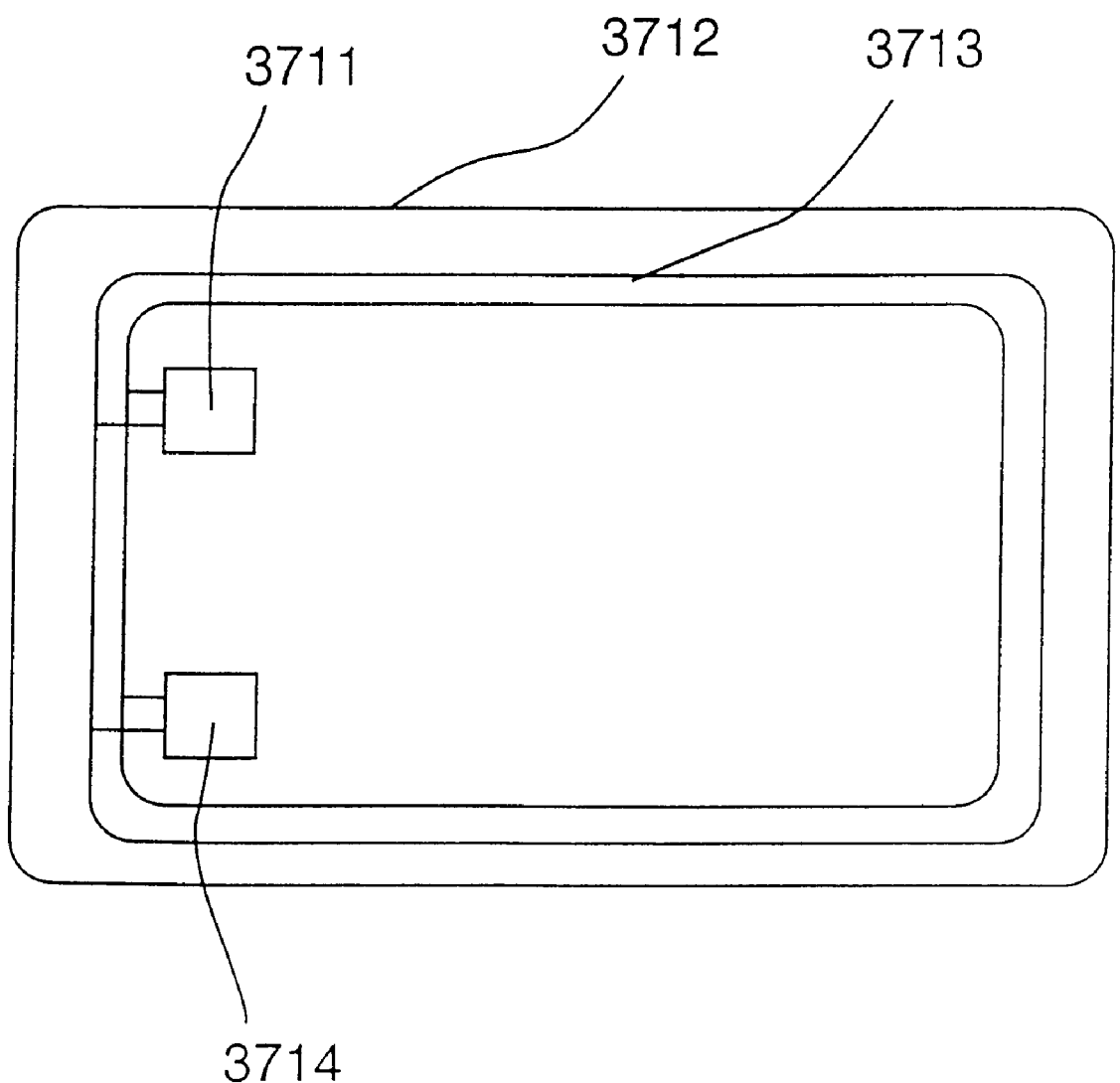
FIG. 37 is a plan view of a card-like semiconductor device according to the present invention.

FIG. 37 is a plan view of a semiconductor device provided with a first thin chip 3711 and a second thin chip 3714, both for storing the same information. In FIG. 37, numeral 3712 denotes an IC card, and numeral 3713 denotes a conductive pattern including a coil. Since the same information is stored in multiple places, it is possible to enhance the possibility of data recovery, even in the event of the destruction of the IC card.

Figure 38:
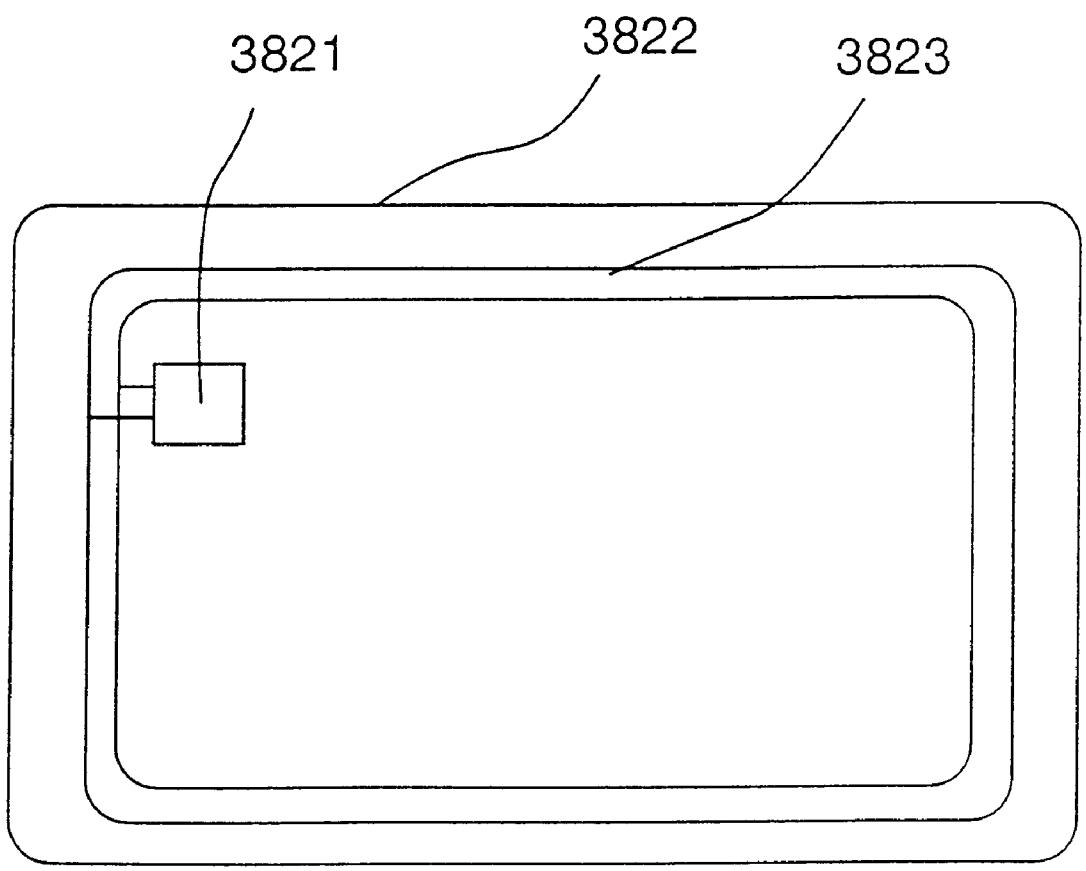
FIG. 38 is a plan view of a conventional IC card.

On the other hand, a conventional IC card is shown in FIG. 38. In the same figure, the numeral 3821 denotes an IC chip containing memory, numeral 3822 denotes an IC card, and the numeral 3823 denotes a coil. In this structure only one chip is used, so in the event of destruction by cracking, for example, recovery is very difficult and a large amount of money or a large volume of important data, such as secret keys are lost, with the consequent strong likelihood of the social credit being lost.

Figure 39:
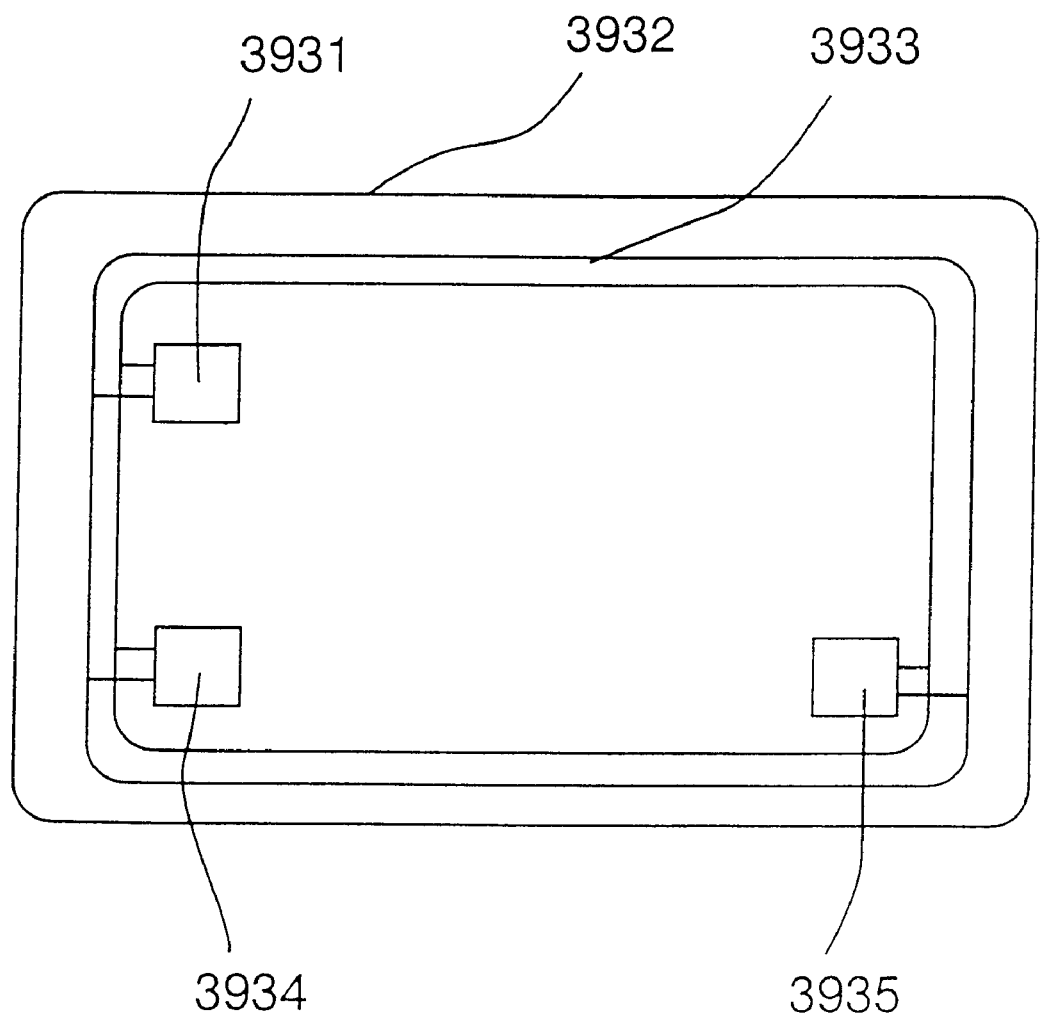
FIG. 39 is a plan view of a card-like semiconductor device according to the present invention.

FIG. 39 shows a semiconductor device provided with a first thin chip 3931, a second thin chip 3934, and a third thin chip 3935, each having memory capable of storing the same contents. In FIG. 39, the numeral 3932 denotes a card-like semiconductor device, and the numeral 3933 denotes a conductive pattern. Since it is rarely the case that three chips are destroyed at one time, there can be ensured a higher reliability than in the semiconductor device shown in FIG. 37.

Figure 40:
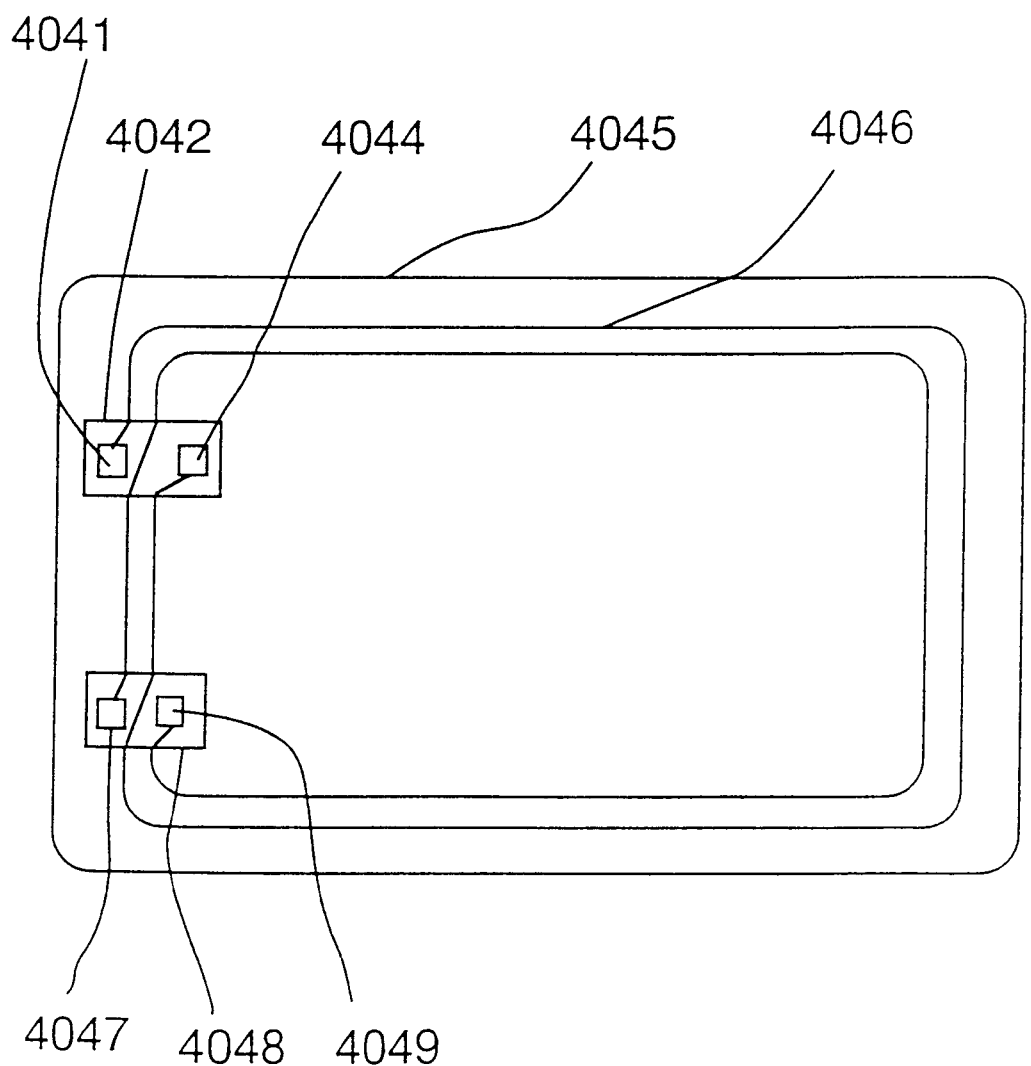
FIG. 40 is a plan view of a card-like semiconductor device according to the present invention.
Figure 41:
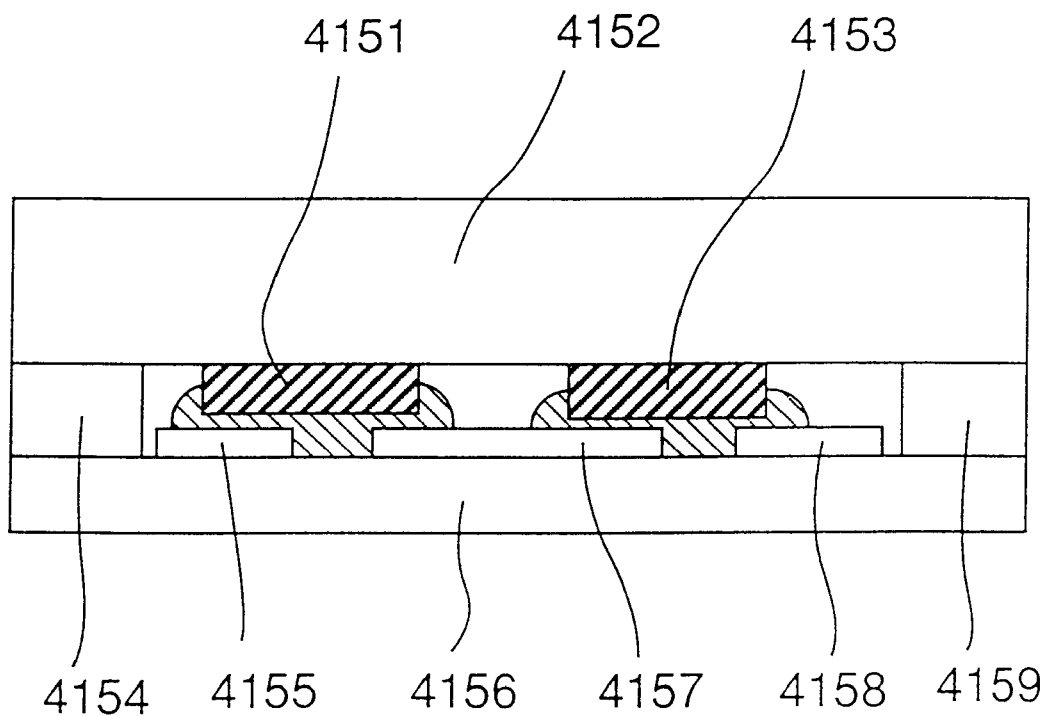
FIG. 41 is a sectional view of a principal portion of a conventional thin IC card.

FIG. 40 shows a modification of the semiconductor device illustrated in FIG. 37. In FIG. 40, the numeral 4042 denotes a first thin chip, numerals 4041 and 4044 denote external electrodes of the first thin chip, numeral 4045 denotes an IC card, numeral 4046 denotes a conductive pattern, numeral 4048 denotes a second thin chip, and the numerals 4047 and 4049 denote external electrodes of the second thin chip.

On the IC card 4045, a conductive pattern 4046 is formed including a coil printed on one side only of a thin substrate (not shown). To be more specific, a loop is provided having one end connected to a first electrode 4041 of the first thin chip 4042 and an opposite end connected to a second electrode 4044 of the first thin chip, and also a loop having one end connected to a first electrode 4047 of the second thin chip 4048 and an opposite end connected to a second electrode 4049 of the second thin chip. Since one-sided printing will do for both loops, it is possible to improve the economy.

Figure 42:
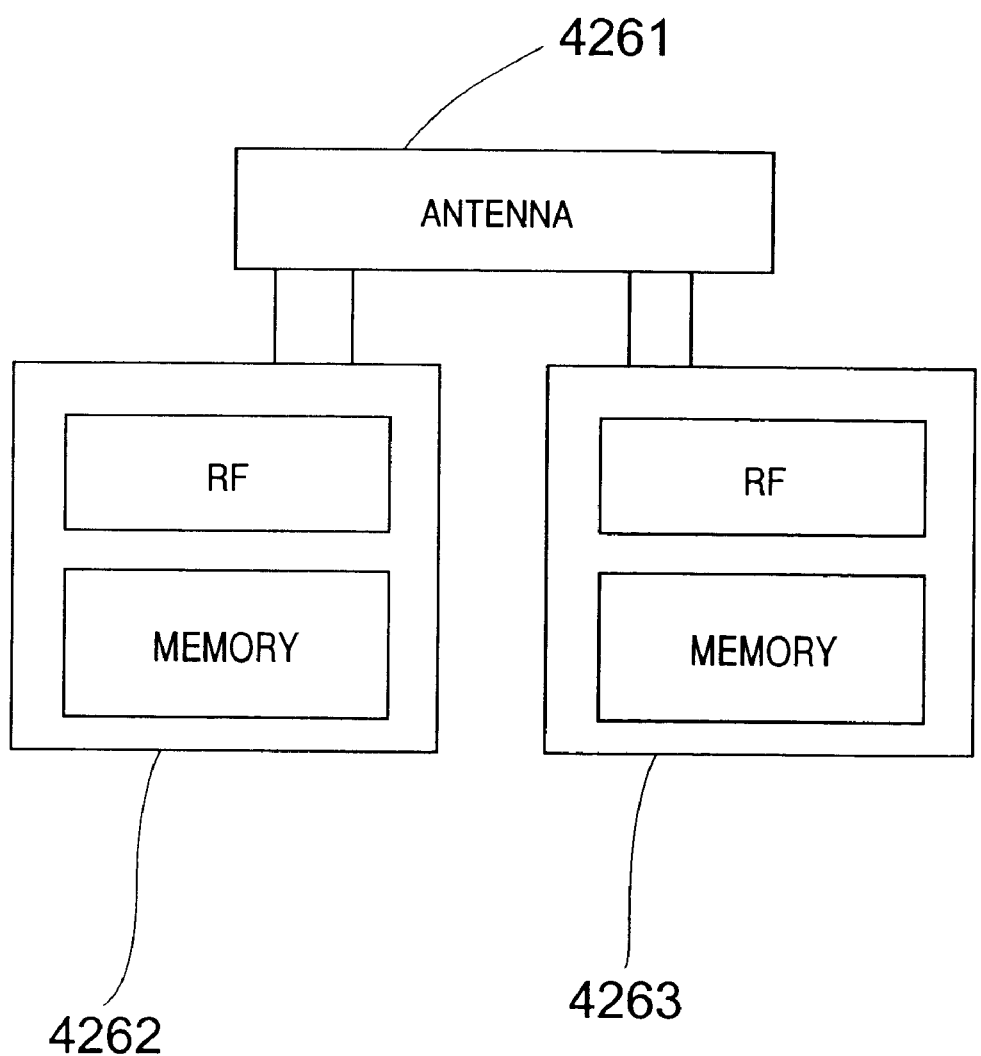
FIG. 42 is a diagram showing the relation of the connection between IC chips and an antenna according to the present invention.

FIG. 42 illustrates the architecture of thin chips and antenna (coils) used in the semiconductor device shown in FIG. 37. Two thin chips 4262 and 4263 are connected to an antenna 4261. The thin chips are each provided with an RF (radio frequency) circuit (a high-frequency circuit) and memory. The same contents are stored in the memories, so in the event of the destruction of one memory, there will occur an impedance variation in the antenna will occur. This impedance variation may be used to detect an alarm. Consequently, it is possible to detect the destruction of the semiconductor chip and let information be re-stored in another memory means (another IC card).

Figure 43:
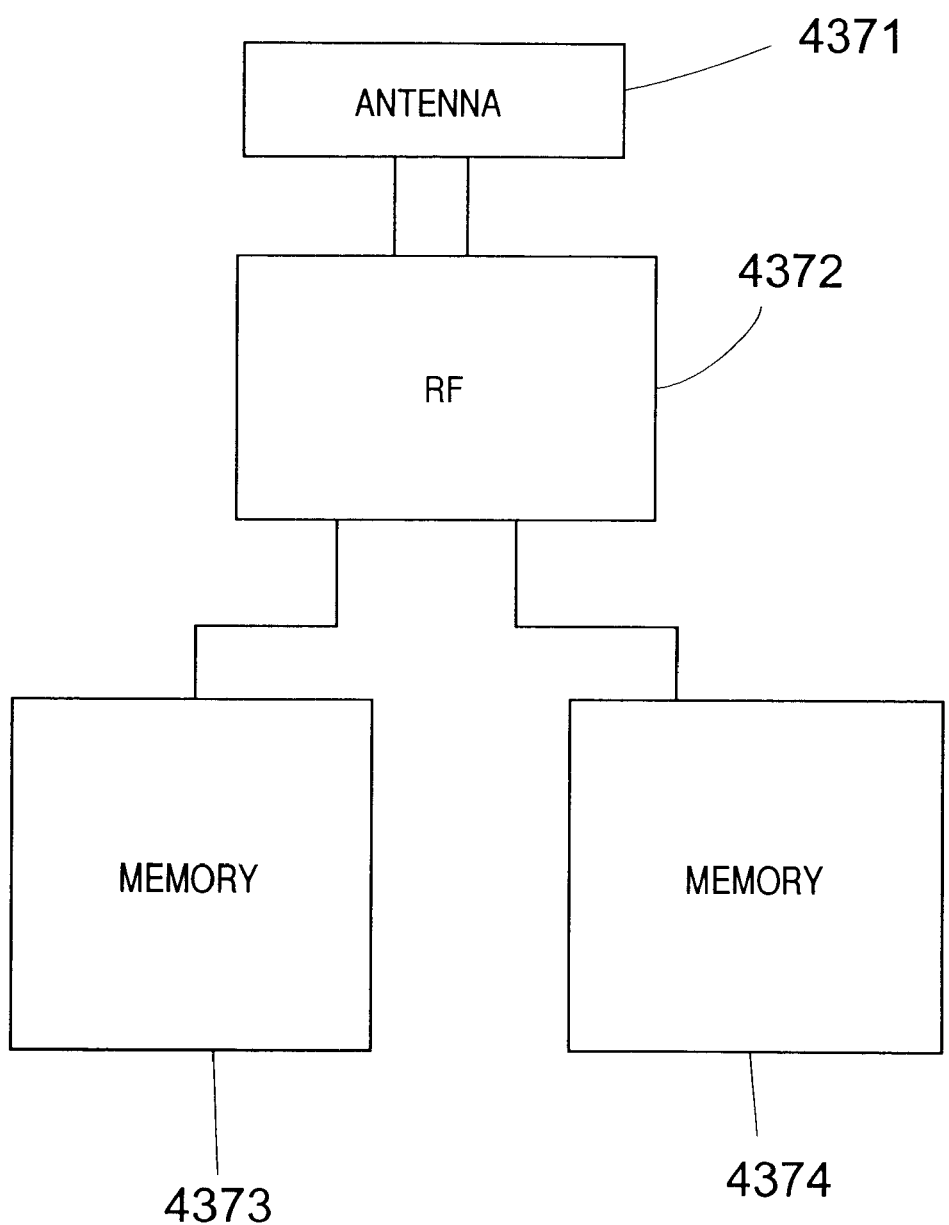
FIG. 43 is a diagram showing the relation of the connection between IC chips and an antenna according to the present invention.

FIG. 43 is a modification of the architecture shown in FIG. 42. An RF circuit chip 4372 is connected to an antenna 4371. With this RF circuit as a master, there are two slave memories 4373 and 4374 are included. Even in the event of the destruction of any one chip, it is possible to read the memory contents. Further, by utilizing the point that the status in destruction is different, it is possible to derive an alarm signal from the antenna. Unlike the configuration of FIG. 42, since the RF circuit is made to be separate and independent, it is possible to select suitable memories out of various memories, thus permitting the fabrication of IC cards according to applications.

Figure 44:
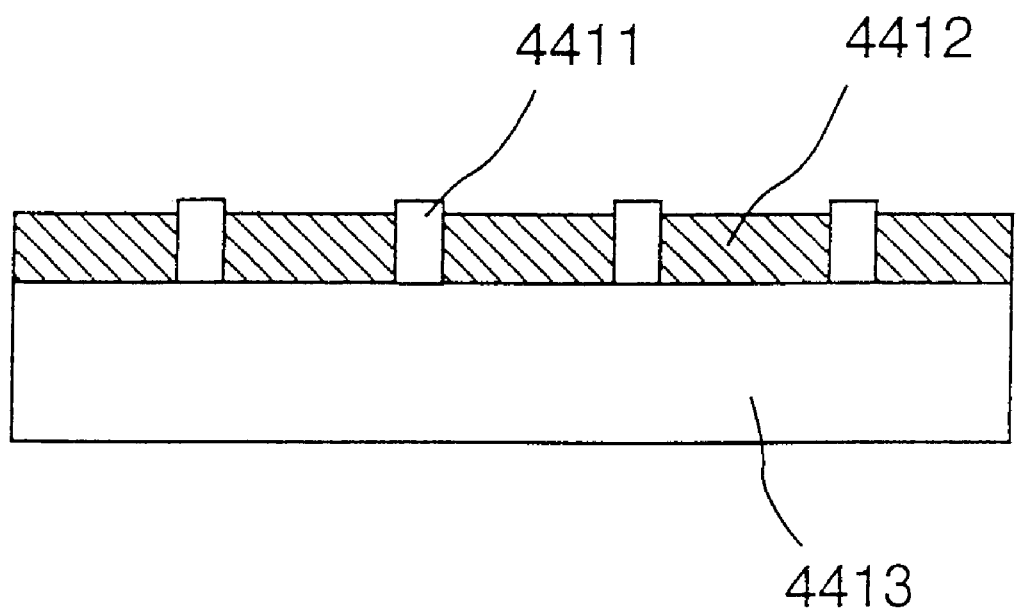
FIG. 44 is a sectional view of a principal portion of an IC chip according to the present invention.

FIG. 44 is a sectional view showing external terminal portions of a thin chip 4413. In the same figure, the numeral 4411 denotes a gold-plated bump and the numeral 4412 denotes a polyimide resin. The gold-plated bumps 4411 are formed on the surface of the thin chip 4413, with polyimide resin 4412 being filled in between adjacent bumps. The presence of the polyimide resin on the surface of the thin chip is advantageous in that it is possible to diminish the occurrence of flaws on the thin chip surface caused by particles at the time when the chip is bonded to a card substrate using an anisotropic conductive film.

Figure 45:
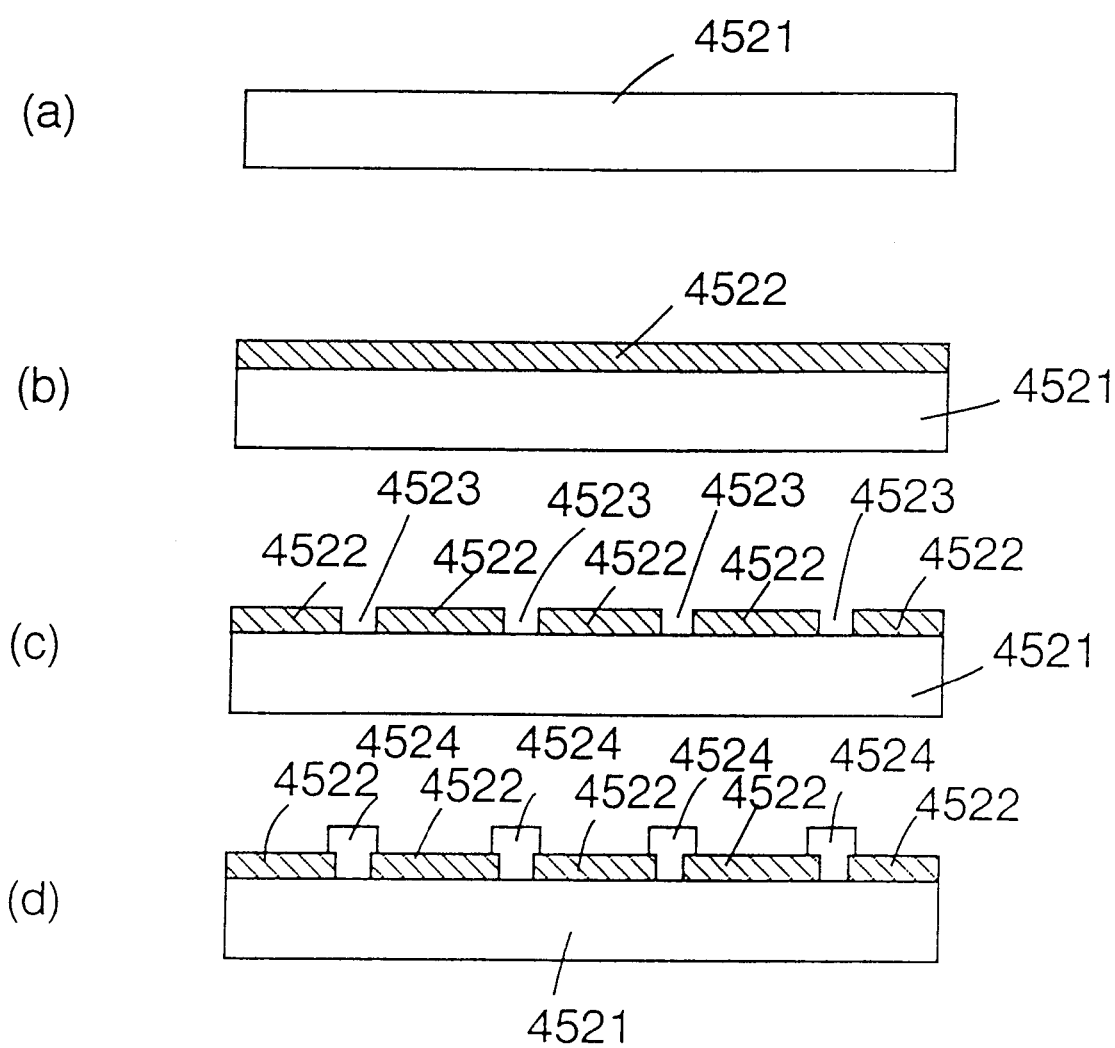
FIGS. 45(a) to 45(d) are sectional views showing an external terminal forming process in a conventional IC chip.

FIGS. 45(a) to 45(d) illustrate a conventional external terminal manufacturing process which can be applied for obtaining the above structure. Reference will now be made to a polyimide film as an example. First, a semiconductor wafer 4521 with a semiconductor device formed on the surface thereof is provided (FIG. 45(a)). Next, the wafer surface is coated with a polyimide film 4522 (FIG. 45(b)). The polyimide film thus coated on the wafer surface is then subjected to a photoresist step to form the apertures 4523 for electrode portions (FIG. 45(c)). Thereafter, gold-plated portions 4524 are formed in the apertures, as shown in FIG. 45(d). Thus, the conventional process requires the photoresist step, which is uneconomical.

A gold-plated bump manufacturing process according to the present invention will be described below with reference to FIGS. 46(a) to 46(d).

Figure 46:
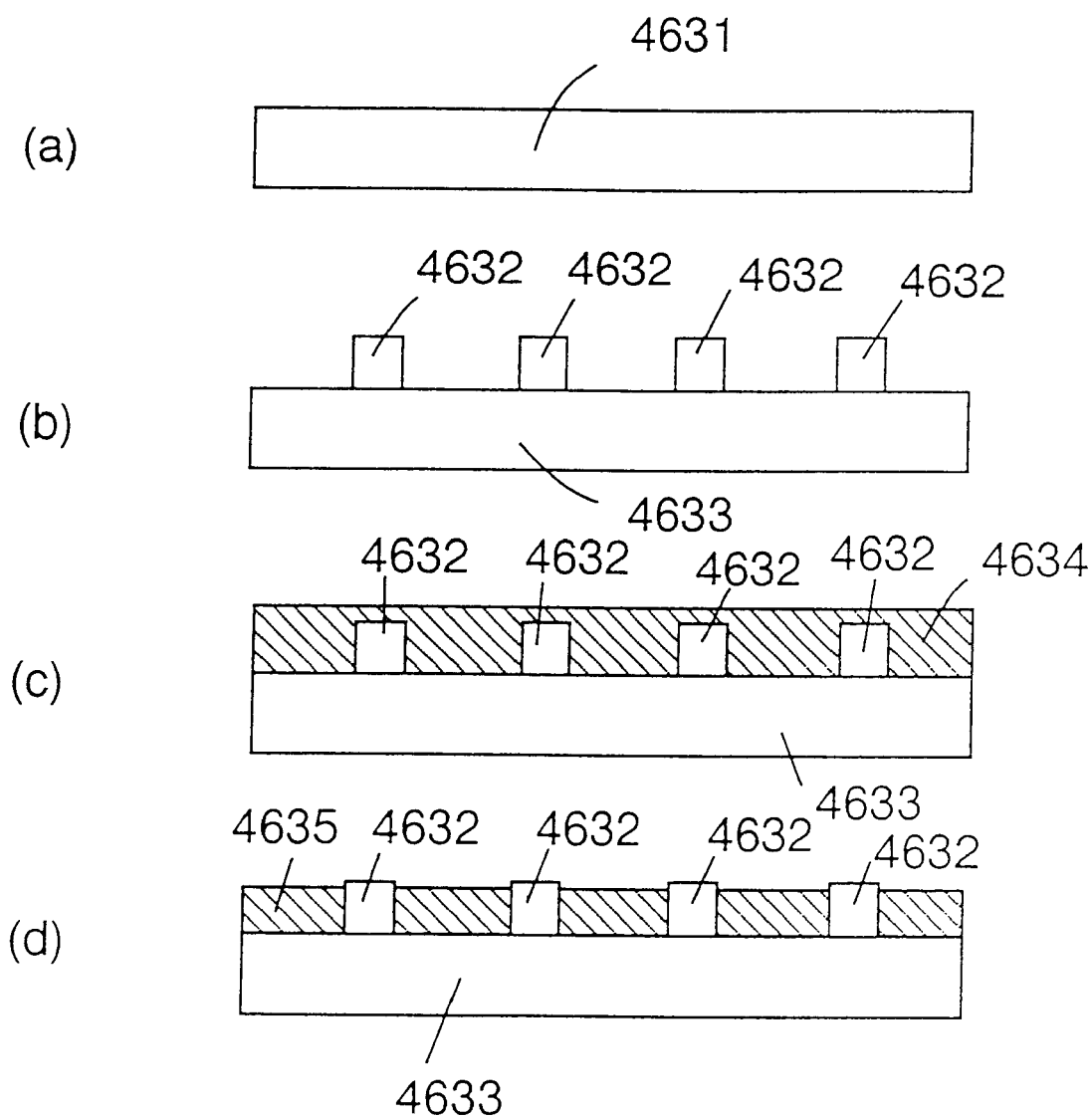
FIGS. 46(a) to 46(d) are sectional views showing an external terminal forming process in an IC chip according to the present invention.

First, a wafer 4631 with a semiconductor device already formed thereon is provided (FIG. 46(a)). Next, gold-plated bumps 4632 are formed on a surface-treated wafer 4633 (FIG. 46(b)). Further, the wafer 4633 is coated with a polyimide resin film 4634 throughout the whole surface thereof (FIG. 46(c)). Thereafter, the surface of the polyimide resin film is subjected to an ashing treatment to expose the surfaces of the gold-plated bumps, thus allowing the polyimide resin film 4635 present in the gold bump-free area to remain (FIG. 46(d)). Thus, the photoresist step for the polyimide film is not needed, permitting a low-cost production.

Heretofore, the use of a polyimide resin has been unnecessary if a plastic seal is not conducted. More particularly, in plastic seal, a polyimide film has been used for reducing a stress applied to wiring on the surface of an IC chip and for preventing migration thereby. Therefore, the use of a polyimide film has not always been necessary.

In the present invention, however, a unique effect can be obtained which is different from the effect heretofore obtained by the use of a polyimide film.

The usefulness of a polyimide resin film will be described below with reference to FIG. 47.

Figure 47:
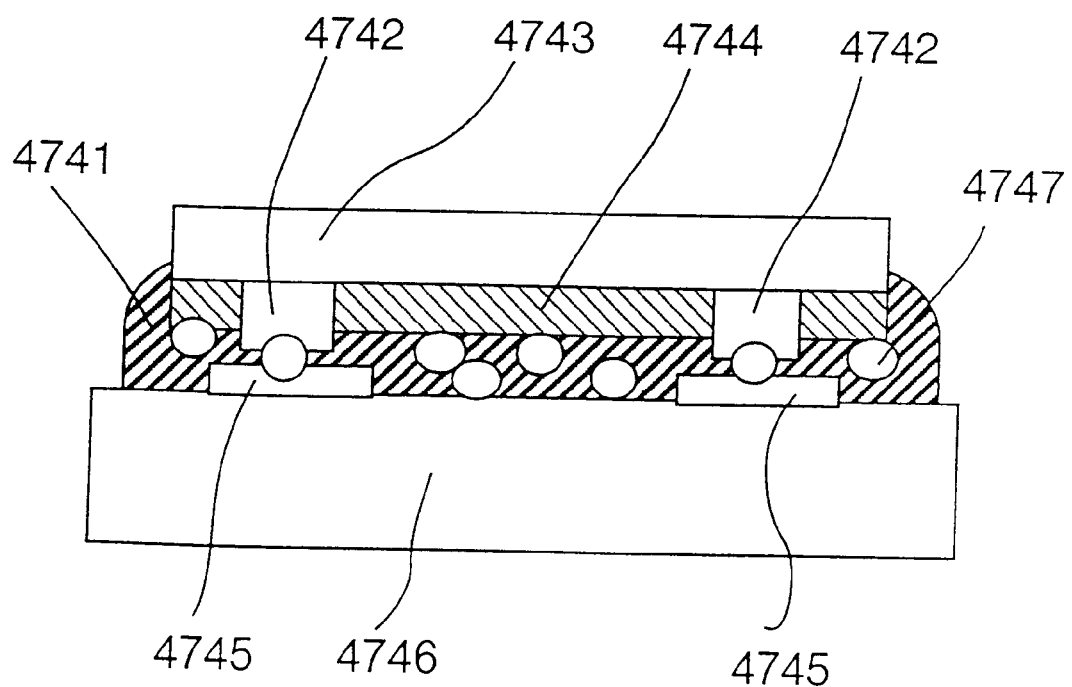
FIG. 47 is a sectional view of a principal portion of a card-like semiconductor device according to the present invention.

FIG. 47 is a sectional view showing a connection between conductive patterns 4745 formed on a thin substrate 4746 and external terminals 4742 of a thin chip 4743. In the same figure, the numeral 4744 denotes a polyimide resin film, numeral 4741 denotes an anisotropic conductive adhesive, and the numeral 4747 denotes conductive particles contained in the anisotropic conductive adhesive.

In the area of the conductive pattern electrodes 4745 formed on the thin substrate 4746, fine conductive particles are pressed down strongly to a buried extent for securing the connection. Since the polyimide resin film 4744 is formed between gold-plated bumps (external terminals) 4742, a stable connection can be ensured without damaging the surface of the thin chip 4743 even when attacked by hard conductive particles 4747 contained in the anisotropic conductive adhesive 4741.

Figure 48:
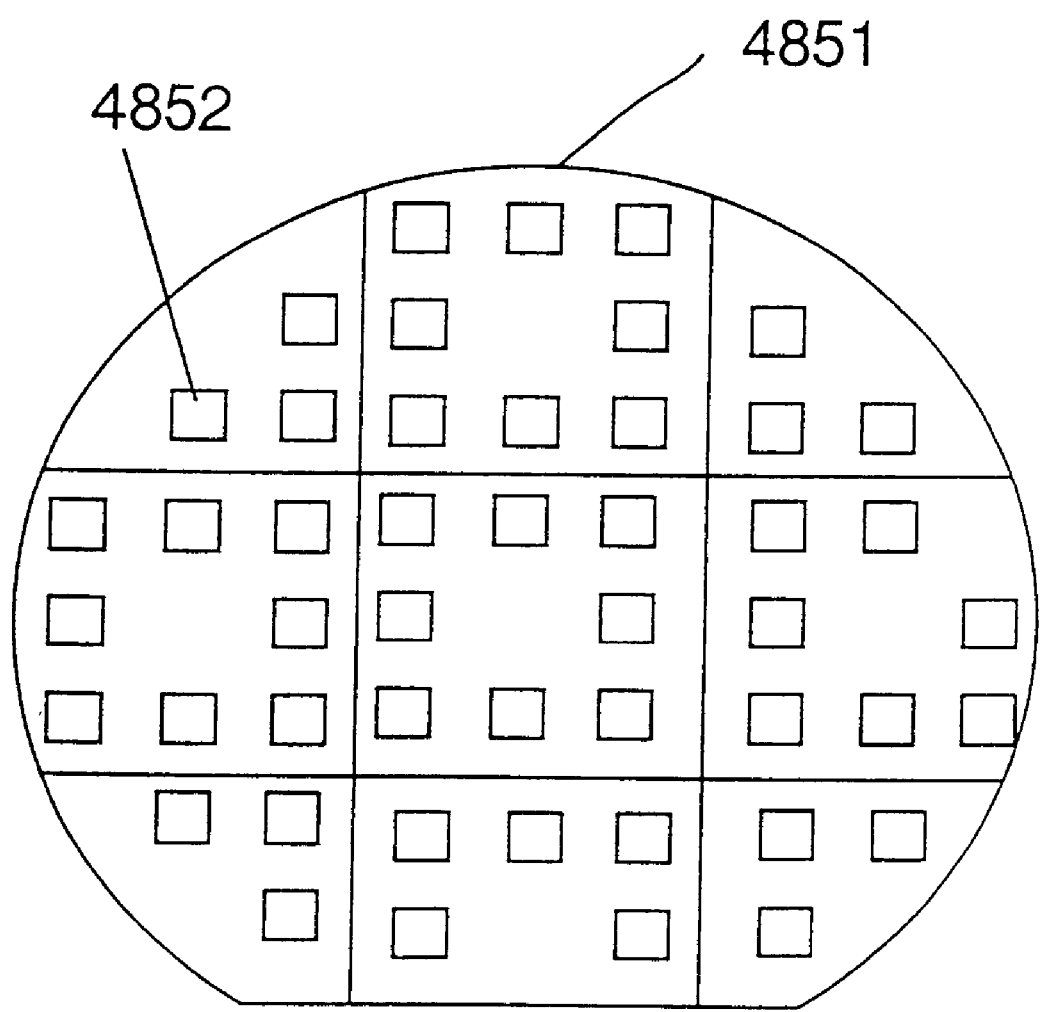
FIG. 48 is a plan view showing an example of an arrangement of gold-plated bumps on a wafer according to the present invention.

FIG. 48 is a plan view showing a layout example of gold-plated bumps 4852 on a wafer 4851. Generally, bumps are formed in a peripheral area of a semiconductor chip.

A card-like semiconductor device illustrated in this figure, by sending and receiving signals to and from a card reader, is applicable as electronic money, member's cards, credit, electronic keys, resident cards, health insurance cards, licenses, commutation tickets, electronic tickets, or electronic slips.

An example of its application as an employee card will be given below.

An employee card having a memory in which are stored the name of the company, assigned post, name of the person, and employee number is delivered to a person entering a company. For example, this employee card is read by a card reader disposed on a reception desk of each work section and is collated with information stored separately (in a computer for management), whereby it is possible to check whether the person carrying the employee card is actually the employee.

In the case of an electronic ticket, a ticket acquired in exchange for a charge is read by a card reader disposed in an entrance gate and, on the basis of the read information, a check is made to see if the ticket is proper or not, then if the ticket is proper, the gate is opened to permit entrance.

Thus, by using a card-like semiconductor device, it is possible to build various systems including a card reader.

Particularly, a card-like semiconductor device provided with a reinforcing plate is strong against not only a bending stress but also a local stress, so it is employable even under a mechanically severe environment.

Industrial Applicability

The present invention is applicable to electronic money, member's cards, credit, electronic keys, resident cards, health insurance cards, licenses, commutation tickets, electronic tickets, or electronic slips.

What is claimed is:

1. A method for manufacturing card-like semiconductor devices, comprising the steps of:

providing a semiconductor wafer having a plurality of ICs formed thereon;

removing the back side of the semiconductor wafer to thin the wafer into a thickness of 0.1 to 110 $\mu$m;

affixing a metallic plate as a reinforcing plate to the back of the thus-thinned semiconductor wafer to reduce a local stress of each of the ICs;

cutting the semiconductor wafer into a plurality of IC chips with the metallic plate affixed thereto to form a plurality of laminates each comprised of a piece of the metallic plate and one of the IC chips; and mounting the laminate onto a card-like substrate.

2. A method for manufacturing card-like semiconductor devices according to claim 1, further comprising the steps of forming a projection-like bump on a connecting terminal portion of said one of said IC chips, coating the projection-like bump with a plastic resin, and exposing the projection-like bump by deleting the plastic resin by ashing, wherein said IC chip is face-down-bonded to said card-like substrate.

3. A method for manufacturing card-like semiconductor devices according to claim 1, wherein said semiconductor wafer with the metallic plate affixed thereto is cut by using a laser beam.

4. A method for manufacturing card-like semiconductor devices according to claim 1, wherein said semiconductor wafer with metallic plate affixed thereto is cut by dicing.

5. A method for manufacturing card-like semiconductor devices according to claim 1, wherein the thickness of said metallic plate is nearly the same as that of said semiconductor wafer which is made into a thin film.

6. A method for manufacturing card-like semiconductor devices according to claim 1, wherein said metallic plate is made of tungsten or stainless steel.

7. A method for manufacturing card-like semiconductor devices, comprising the steps of:

providing a semiconductor wafer with a plurality of ICs formed thereon;

removing the back side of the semiconductor wafer to thin the wafer into a thickness of 0.1 to 110 $\mu$m;

cutting the semiconductor wafer to form a plurality of IC chips;

providing a plurality of thin substrates with a conductive pattern formed thereon;

opposing each of the cut IC chips to a corresponding one of the thin substrates and connecting an external terminal formed on one side of each of the IC chips to the conductive pattern of the corresponding one of the thin substrates;

attaching a reinforcing plate for reducing a local stress imposed on each IC chip to an opposite side of each IC chip; and forming cover sheets so as to sandwich therebetween each IC chip with the reinforcing plate attached thereto.

8. A method for manufacturing card-like semiconductor devices according to claim 7, wherein each IC chip and reinforcing plate are bonded to each other.

9. A method for manufacturing card-like semiconductor devices according to claim 7, wherein each IC chip and reinforcing plate are affixed together using a bubble separation film.

10. A method for manufacturing card-like semiconductor devices according to claim 7, further comprising the steps of forming a projection-like bump on a connecting terminal portion of each IC chip, coating the projection-like bump with a plastic resin, and exposing the projection-like bump by deleting the plastic resin by ashing, wherein said external terminal of each IC chip is connected by using a conductive adhesive.

11. A method for manufacturing card-like semiconductor devices according to claim 7, wherein said each card-like semiconductor device has a spacer disposed around the IC chip.

12. A method for manufacturing card-like semiconductor devices according to claim 7, wherein each said card-like semiconductor device has other reinforcing plates disposed so as to sandwich the IC chip.

13. A method for manufacturing card-like semiconductor devices according to claim 7, wherein each said card-like semiconductor device includes a plurality of IC chips.

14. A method for manufacturing card-like semiconductor devices according to claim 7, wherein each said IC chip is nearly the same size as said reinforcing plate.

15. A method for manufacturing card-like semiconductor devices according to claim 7, wherein the reinforcing plate is formed of material higher in Young's modulus than the cover sheet.

16. A method for manufacturing card-like semiconductor devices according to claim 7, wherein each said card-like semiconductor device has a spacer disposed around the reinforcing plate.

17. A method for manufacturing card-like semiconductor devices according to claim 7, wherein each said card-like semiconductor device is a noncontact type IC card.

18. A method for manufacturing card-like semiconductor devices according to claim 7, wherein each said card-like semiconductor device is a contact type IC card.

19. A method for manufacturing card-like semiconductor devices according to claim 7, wherein each IC chip includes a high-frequency circuit and a memory section.

20. A method for manufacturing card-like semiconductor devices according to claim 7, wherein the reinforcing plate has a shading characteristic.

21. A method for manufacturing card-like semiconductor devices according to claim 7, wherein each IC chip includes a once-write type memory section.

22. A method for manufacturing card-like semiconductor devices according to claim 7, wherein each said card-like semiconductor device includes a magnetic tape.

23. A method for manufacturing card-like semiconductor devices according to claim 7, wherein the thickness of said metallic plate is nearly the same as that of said semiconductor wafer which is made into a thin film.

24. A method for manufacturing card-like semiconductor devices according to claim 7, wherein said metallic plate is made of tungsten or stainless steel.

* * * * *